United States Patent
Lee et al.

(10) Patent No.: US 12,347,096 B2
(45) Date of Patent: Jul. 1, 2025

(54) SEMICONDUCTOR MEASUREMENT APPARATUS

(71) Applicant: Samsung Electronics Co., Ltd., Suwon-si (KR)

(72) Inventors: Myungjun Lee, Seongnam-si (KR); Jinseob Kim, Suwon-si (KR); Wookrae Kim, Suwon-si (KR); Jinyong Kim, Suwon-si (KR); Jaehwang Jung, Suwon-si (KR); Sungho Jang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 211 days.

(21) Appl. No.: 18/060,830

(22) Filed: Dec. 1, 2022

(65) Prior Publication Data
US 2023/0186460 A1    Jun. 15, 2023

(30) Foreign Application Priority Data
Dec. 10, 2021   (KR) .................. 10-2021-0176268

(51) Int. Cl.
  *G06T 7/00*    (2017.01)
  *H04N 23/10*   (2023.01)
  (Continued)

(52) U.S. Cl.
  CPC ............. *G06T 7/001* (2013.01); *H04N 23/10* (2023.01); *H04N 23/56* (2023.01);
  (Continued)

(58) Field of Classification Search
  CPC .......... G06T 7/001; G06T 2207/10152; G06T 2207/20021; G06T 2207/30148;
  (Continued)

(56) References Cited

U.S. PATENT DOCUMENTS 8,107,084 B2 *   1/2012   Davidson ............... G02B 21/04
                                                  356/497
9,880,377 B1 *   1/2018   Safrani .................. G02B 21/22
                          (Continued)

FOREIGN PATENT DOCUMENTS

| KR | 2012/0053043 A | 5/2012 |
| KR | 2018/0045026 A | 5/2018 |
| KR | 101930836 B1   | 12/2018 |
| KR | 2020/0131908 A | 11/2020 |
| KR | 2021/0043661 A | 4/2021 |

*Primary Examiner* — Jared Walker
(74) *Attorney, Agent, or Firm* — HARNESS, DICKEY & PIERCE, P.L.C.

(57) ABSTRACT

A semiconductor measurement device may include an illumination apparatus having a polarizer on a propagation path of light output from a light source; an optical assembly including an objective lens configured to allow light passing through the polarizer to be incident on a sample and a beam splitter configured to transmit light reflected from the sample to first and second sensors; and a controller. The controller may be configured to determine an alignment state of patterns in a first region of the sample using a first original image output by the first sensor and an alignment state of patterns in a second region of the sample using a second original image output by the second sensor. The first sensor includes a first image sensor and a self-interference generator in a path along which light is incident on the first image sensor. The second sensor includes a second image sensor.

12 Claims, 26 Drawing Sheets

(51) Int. Cl.
*H04N 23/56* (2023.01)
*H10B 12/00* (2023.01)

(52) U.S. Cl.
CPC .............. *G06T 2207/10152* (2013.01); *G06T 2207/20021* (2013.01); *G06T 2207/30148* (2013.01); *H10B 12/00* (2023.02)

(58) Field of Classification Search
CPC ...... G06T 7/0004; H04N 23/10; H04N 23/56; H10B 12/00; G01N 21/211; G01N 21/8806; G01N 21/956; G01N 2021/8845; G01N 2021/8848; G01B 11/2441; H01L 22/12
See application file for complete search history.

(56) References Cited

U.S. PATENT DOCUMENTS

| | | |
|---|---|---|
| 10,018,919 B2 | 7/2018 | Lee et al. |
| 2010/0328655 A1 | 12/2010 | Den Boef |
| 2014/0192338 A1 | 7/2014 | Den Boef |
| 2015/0323316 A1 | 11/2015 | Shchegrov et al. |
| 2016/0313654 A1* | 10/2016 | Zeng .................... G01B 11/272 |
| 2017/0082932 A1* | 3/2017 | Fu .......................... G03F 9/7065 |
| 2019/0285407 A1 | 9/2019 | Chuang et al. |
| 2020/0240907 A1 | 7/2020 | Wang et al. |
| 2021/0028035 A1 | 1/2021 | Lee et al. |
| 2022/0035257 A1* | 2/2022 | Goorden ............. G03F 7/70583 |
| 2022/0397392 A1* | 12/2022 | Courteville .............. G01H 9/00 |

\* cited by examiner

330

331

SEMICONDUCTOR MEASUREMENT APPARATUS

CROSS-REFERENCE TO RELATED APPLICATION(S)

This application claims benefit of priority to Korean Patent Application No. 10-2021-0176268, filed on Dec. 10, 2021 in the Korean Intellectual Property Office, the disclosure of which is incorporated herein by reference in its entirety.

BACKGROUND

The present disclosure relates to a semiconductor measurement device.

Using ellipsometry, a semiconductor measurement apparatus may measure an overlay, representing a critical dimension and an alignment state of a structure, in a sample including the structure formed by a semiconductor process. In ellipsometry, an overlay may be generally determined by irradiating light to a sample at a fixed azimuthal angle and an incidence angle and using a spectral distribution of the light reflected from the sample. As sizes of structures formed in a semiconductor process and a gap between the structures may gradually decrease, an overlay may vary, depending on regions even within the same semiconductor chip, resulting in inaccurate measurement of the overlay using a spectral distribution obtained by ellipsometry.

SUMMARY

Example embodiments provide a semiconductor measurement apparatus for accurately measuring an overlay from not only patterns formed in a separation region between semiconductor chip regions, but also patterns formed in at least one of semiconductor chip regions.

According to an example embodiment, a semiconductor measurement apparatus may include an illumination apparatus including a light source and a polarizer, the light source configured to output light, the polarizer disposed on a propagation path of light output from the light source; an optical assembly including an objective lens and a beam splitter; and a controller. The objective lens may be configured to allow light passing through the polarizer to be incident on a sample, and the beam splitter may be configured to transmit light reflected from the sample to a first sensor and a second sensor. The controller may be configured to determine an alignment state of patterns included in a first region of the sample using a first original image output by the first sensor, and the controller may be configured to determine an alignment state of patterns included in a second region of the sample using a second original image output by the second sensor. The first sensor may include a first image sensor and a self-interference generator disposed in a path along which light is incident on the first image sensor, and the second sensor may include a second image sensor.

According to an example embodiment, a semiconductor measurement apparatus may include an illumination apparatus including a light source and a polarizer disposed on a propagation path of light output from the light source; an optical assembly including an objective lens; and a controller. The objective lens may be configured to allow light passing through the polarizer to be incident on a sample, and the optical assembly may be configured to transmit light reflected from the sample to a sensor. The controller may be configured to change a wavelength band of light output from the light source, to receive images from the sensor to obtain three-dimensional data in which the images are arranged along the wavelength band, and to divide at least one of the images into a first image and a second image. The first image may correspond to an intensity difference of a polarization element of light reflected from the sample. The second image may correspond to a phase difference of the polarization element of the light reflected from the sample. The controller may be configured to select data having highest sensitivity in at least one of the first image and the second image for each wavelength band. The controller may be configured to measure an overlay of a region, in which the light is reflected from the sample, using the data selected.

According to an example embodiment, a semiconductor measurement apparatus may include illumination apparatus, a first image sensor, a second image sensor, and a controller, and a controller. The illumination apparatus may include a light source and a polarizer. The light source may be configured to output light toward a sample having a plurality of semiconductor chip regions and a separation region. The polarizer may be configured to polarize light output from the light source. The first image sensor may be configured to receive light reflected from the sample while the illumination apparatus outputs light to a first region disposed in at least one of the plurality of semiconductor chip regions. The first image sensor may be configured to generate a first original image, representing an interference pattern of light on a two-dimensional plane defined in a location of a pupil of an objective lens included the illumination apparatus, by a single shutter operation. The second image sensor may be configured to receive light reflected from the sample while the illumination apparatus outputs light to a second region disposed in the separation region. The second image sensor may be configured to generate a second original image corresponding to a pupil image of the second region. The controller may be configured to determine an overlay of the first region using the first original image and to determine an overlay of the second region using the second original image.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
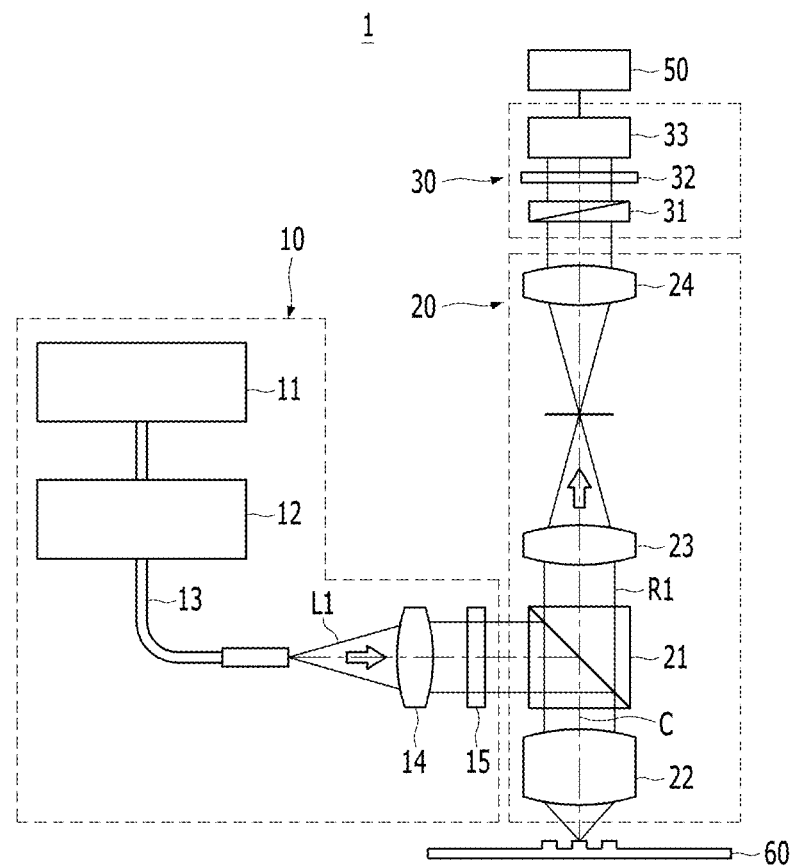
FIGS. 1 and 2 are schematic diagrams illustrating a semiconductor measurement apparatus according to an example embodiment.
Figure 2:
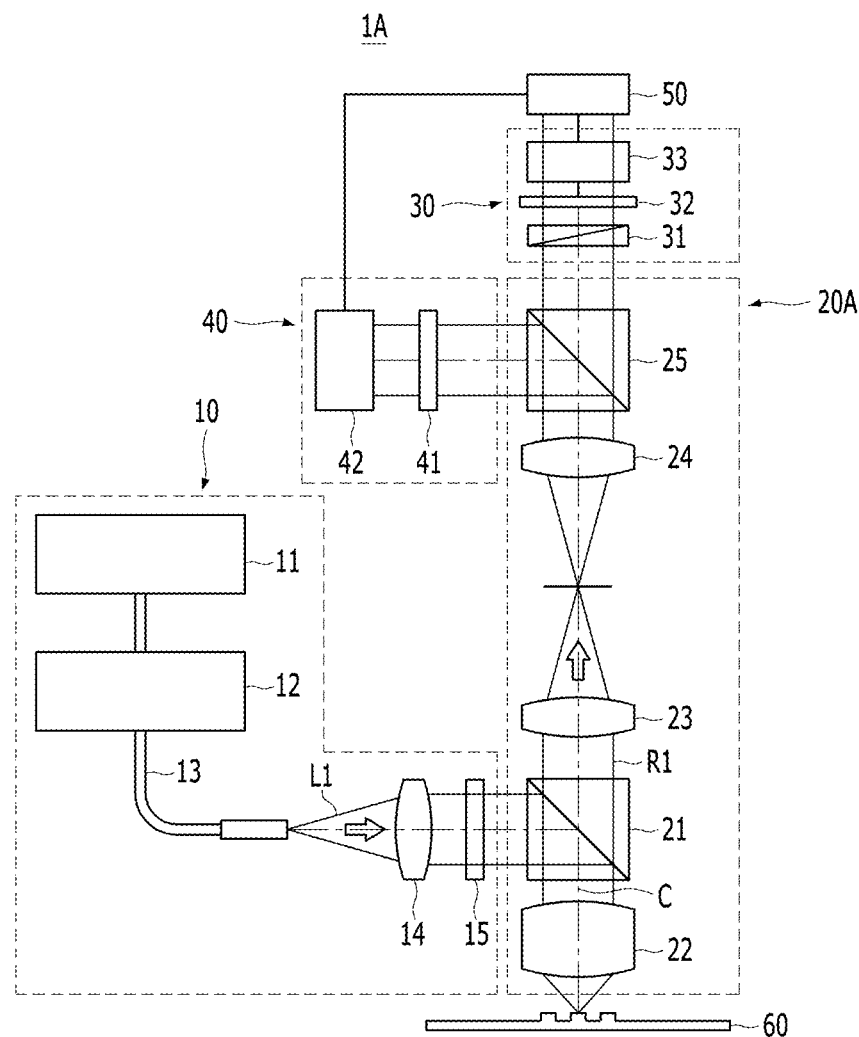

FIGS. 1 and 2 are schematic diagrams illustrating a semiconductor measurement apparatus according to an example embodiment.

Referring to FIG. 1, a semiconductor measuring apparatus 1 according to an example embodiment may be an apparatus using ellipsometry. As illustrated in FIG. 1, the semiconductor measurement apparatus 1 may include an illumination apparatus 10, an optical assembly 20, a first sensor 30, a controller 50, and the like. The semiconductor measurement apparatus 1 may receive light, irradiated to a sample 60 by the illumination apparatus 10 and reflected therefrom, to generate an image and may analyze an image to measure a critical dimension of a structure included in the sample 60. U.S. Patent Publication No. 10,018,919 and U.S. Patent Application Publication No. 2021/0028035 are incorporated herein by reference in their entirety.

The illumination apparatus 10 may include a light source 11, a monochromator 12, a fiber 13, an illumination lens 14, a polarizer 15, and the like. The light source 11 may output light to be incident on the sample 60. The light may be light including an ultraviolet wavelength band to an infrared wavelength band, or may be monochromatic light having a specific wavelength according to an example embodiment. The monochromator 12 may select and emit a desired and/or alternatively predetermined wavelength band from light emitted by the light source 11. In an example embodiment, since the monochromator 12 may irradiate light to the sample 60 while changing the wavelength band of the light emitted by the light source 11, the monochromator 12 may irradiate light having a wide wavelength band to the sample 60. The light source 11 may include a device for emitting light, such as a laser or a light-emitting diode, but is not limited thereto.

The fiber 13 may be a cable-shaped light guide member. Light incident on the fiber 13 may be irradiated to the illumination lens 14. The illumination lens 14 may be a convex lens, and the light may be incident on the polarizer 15 by adjusting an angular distribution of the light irradiated by the fiber 13. As an example, the illumination lens 14 may convert the light, irradiated by the fiber 13, into parallel light. The polarizer 15 may include an optical filter structure.

The polarizer 15 may polarize light, passing through the illumination lens 14 in a desired and/or alternatively predetermined polarization direction, to be incident on the sample 60. In an example embodiment, the polarizer 15 may polarize light in a polarization direction, inclined by 45 degrees with respect to a ground, and light passing through the polarizer 15 may propagate to a first beam splitter 21 of the optical assembly 20.

The first beam splitter 21 may reflect a portion of light received through the polarizer 15 and may transmit another portion of the received light. Light reflected from the first beam splitter 21 may be incident on an objective lens 22, and light passing through the objective lens 22 may be incident on the sample 60. As an example, light passing through the objective lens 22 may be incident to focus on a target region of the sample 60.

When the light passing through the objective lens 22 is reflected in the target region of the sample 60, the objective lens 22 may receive the reflected light again. In the example embodiment illustrated in FIG. 1, an optical axis C of light incident on and reflected from the sample 60 may be perpendicular to a surface of the sample 60.

Light, irradiated to the sample 60, may include light, linearly polarized in a specific direction. The light, including linearly polarized light, may be condensed to be incident on the target region of the sample 60, and the light may include a P-polarized light component and an S-polarized light component according to an incidence angle determined based on the surface of the sample 60.

The light, reflected from the sample 60, may sequentially pass through the objective lens 22, the first beam splitter 21, and relay lenses 23 and 24. A first relay lens 23 may condense light, passing through the first beam splitter 21, to form an image, and may then allow the light to be incident on a second relay lens 24. The light, passing through the second relay lens 24, may be incident on the first sensor 30.

The first sensor 30 may include a prism member 31, a polarizing element 32, a first image sensor 33, and the like. The prism member 31 and the polarizing element 32 may include a self-interference generator. The prism member 31 may separate light, passing through the optical assembly 20, into light linearly polarized in two directions. As an example, the prism member 31 may be implemented as at least one of a Nomarski prism, a Wollaston prism, or a Rochon prism. Polarization directions of the two directions of the linearly polarized light, generated by the prism member 31, may be defined as a first direction and a second direction, perpendicular to each other, respectively.

The polarization element 32 (e.g., optical filter structure) may transmit light to be polarized in a direction, inclined by 45 degrees from the first and second directions. For example, the polarization element 32 may allow a polarization element of light to pass therethrough in a direction, inclined by 45 degrees from the first direction, and may allow a polarization element of light to pass therethrough in a direction, inclined by 45 degrees from the second direction. The light, passing through the polarization element 32, may be incident on the image sensor 40.

The first image sensor 33 may generate a first original image using the received light. The first original image may be an image including an interference pattern of light passing through the polarizing element 32. The first image sensor 33 may output a first original image to the controller 50, and the controller 50 may process the original image to determine an alignment state of patterns included in a light-irradiated region of the sample 60. As an example, an operation, in which the controller 50 determines the alignment state of the patterns included in the sample 60, may be defined as an operation in which the controller 50 determines an overlay of the sample 60. The first image sensor 33 and second image sensor 42 may include a CMOS image sensor or camera for sensing an image, but are not limited thereto.

As an example, the controller 50 may separate the original image into a first image and a second image. The first image may be an image representing an intensity difference depending on a polarization element of light reflected from the sample 60, and the second image may be an image representing a phase difference depending on the polarization element of the light reflected from the sample 60. The controller 50 may select data having highest sensitivity from at least one of the first image and the second image, and may determine an overlay using the selected data. In an example embodiment, the controller 50 may select data having a largest intensity difference of a polarization element in the first image as data having highest sensitivity, and may select data having a largest phase difference in the second image as data having highest sensitivity.

With the above-described method, the semiconductor measurement apparatus 1 may determine the alignment state of the patterns included in the sample 60. As an example, the semiconductor measurement apparatus 1 may determine an alignment state of patterns formed on the sample 60 to provide an actually operating circuit, rather than patterns formed on the sample 60 to determine only an overlay. Accordingly, yield of the semiconductor process may be improved by accurately determining the alignment state of actual patterns formed by a semiconductor process and adjusting process variables of the semiconductor process.

Referring to FIG. 2, a semiconductor measurement apparatus 1A according to an example embodiment may include an illumination apparatus 10, an optical assembly 20A, a first sensor 30, and a second sensor 40, a controller 50, and the like. In the semiconductor measurement apparatus 1, configurations of the illumination apparatus 10, the optical assembly 20, the first sensor 30, and the controller 50 may be similar to those described above with reference to FIG. 1. For example, the controller 50 may determine an alignment state of patterns, included in a sample 60, using a first original image generated by the first sensor 30. However, the optical assembly 20A may further include a beam splitter 25 allowing light, reflected from the sample 60, to be incident on the first sensor 30 and the second sensor 40.

In an example embodiment, the sample 60 may be a wafer having a plurality of semiconductor chip regions and a separation region between respective semiconductor chip regions of the plurality of semiconductor chip regions. The first sensor 30 may output a first original image while the illumination apparatus 10 irradiates light to a region included in at least one of the plurality of semiconductor chip regions. Accordingly, the controller 50 may determine an alignment state of the patterns formed in some of the plurality of semiconductor chip regions using the first original image.

The second sensor 40 may generate a second original image while the illumination apparatus 10 irradiates light to the separation region. As an example, an overlay key for determining an overlay may be formed in the separation region of the sample 60. The overlay key may include patterns for determining an alignment state between adjacent layers. As an example, patterns included in the overlay key may have a relatively large critical dimension, as compared with patterns formed in a plurality of semiconductor chip regions to provide actually operating circuits.

The second sensor 40 may include a polarization element 41 and a second image sensor 42. The polarization element 41 may polarize light refracted by the beam splitter 25 and may transmit the polarized light to the second image sensor 42, and the second image sensor 42 may generate a second original image. As an example, the second original image may correspond to a pupil image of a region to which the illumination apparatus 10 irradiates light. The controller 50 may determine an alignment state of the patterns included in the overlay key using the second original image generated by the second sensor 40.

The semiconductor measurement apparatus 1A according to the example embodiment illustrated in FIG. 2 may determine an alignment state of patterns, formed in the semiconductor chip region, based on the first original image and may determine an alignment state of patterns, formed in the separation region, based on the original image. Accordingly, the semiconductor measurement apparatus 1A may calculate a miss-reading correction (MRC) value from a difference between an overlay of the patterns in the semiconductor chip region and an overlay of the patterns formed in the separation region without an additional destructive inspection, and may adjust a semiconductor process and improve yield using the MRC value. The semiconductor measurement apparatus 1A may include the MRC value using the controller 50.

Figure 3:
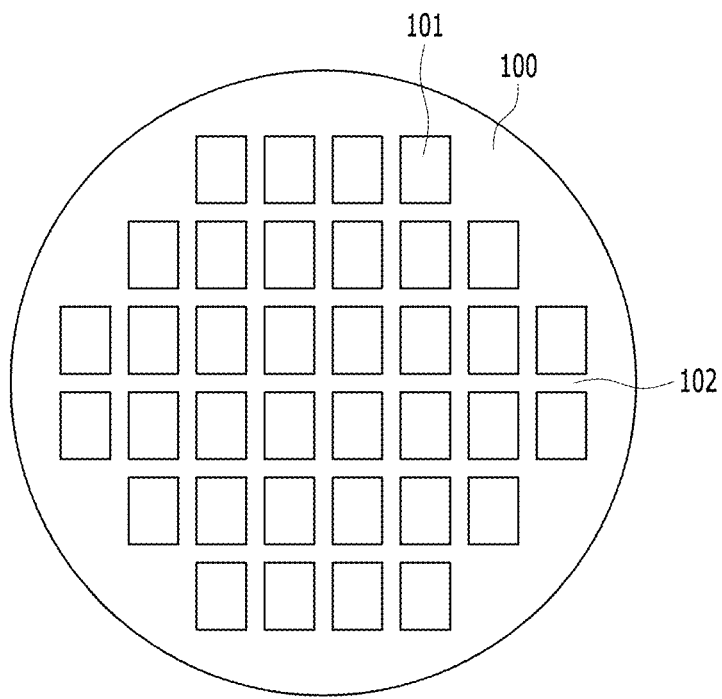
FIG. 3 is a schematic diagram illustrating a target sample of a semiconductor measurement apparatus according to an example embodiment.

FIG. 3 is a schematic diagram illustrating a target sample of a semiconductor measurement apparatus according to an example embodiment.

Referring to FIG. 3, a sample 100 to be measured by the semiconductor measurement apparatus according to an example embodiment may be a wafer including a plurality of semiconductor chip regions 101 and a separation region 102 therebetween. As an example, the separation region 102 may include regions for separating the plurality of semiconductor chip regions 101 from each other by a laser scribing process, or the like.

Devices for implementing a semiconductor chip may be formed in each of the plurality of semiconductor chip regions 101. A test element group (TEG) for testing devices formed in the plurality of semiconductor chip regions 101, an overlay key for determining an alignment state of patterns formed by a semiconductor process in the plurality of semiconductor chip regions 101, and the like, may be formed in the separation region 102.

When the overlay of the sample 100 is determined using the overlay key formed in the separation region 102, an overlay of the plurality of semiconductor chip regions 101 may be inaccurately determined. Even when the patterns included in the overlay key of the separation region 102 are accurately aligned, the patterns may be inaccurately aligned in at least one of the plurality of semiconductor chip regions 101. Alternatively, even when the patterns included in the overlay key of the separation region 102 are inaccurately aligned, the patterns may be accurately aligned in at least one of the plurality of semiconductor chip regions 101.

In an example embodiment, the alignment state of the patterns included in at least one of the plurality of semiconductor chip regions 101 may be directly determined to address the above-described issue. From the alignment state of the overlay key, the alignment state of the patterns formed in the plurality of semiconductor chip regions 101 may be directly determined but the alignment state of the patterns formed in the plurality of semiconductor chip regions 101 may not be predicted. Accordingly, the yield of the semiconductor process of forming the patterns in the plurality of semiconductor chip regions 101 may be improved.

Also, the semiconductor measurement apparatus according to an example embodiment may determine both the overlay of the plurality of semiconductor chip regions 101 and the overlay of the separation region 102. Accordingly, the MRC value may be measured after the semiconductor process without an additional destructive inspection, and process variables, process conditions, and the like, may be adjusted to optimize a semiconductor process.

Figure 4:
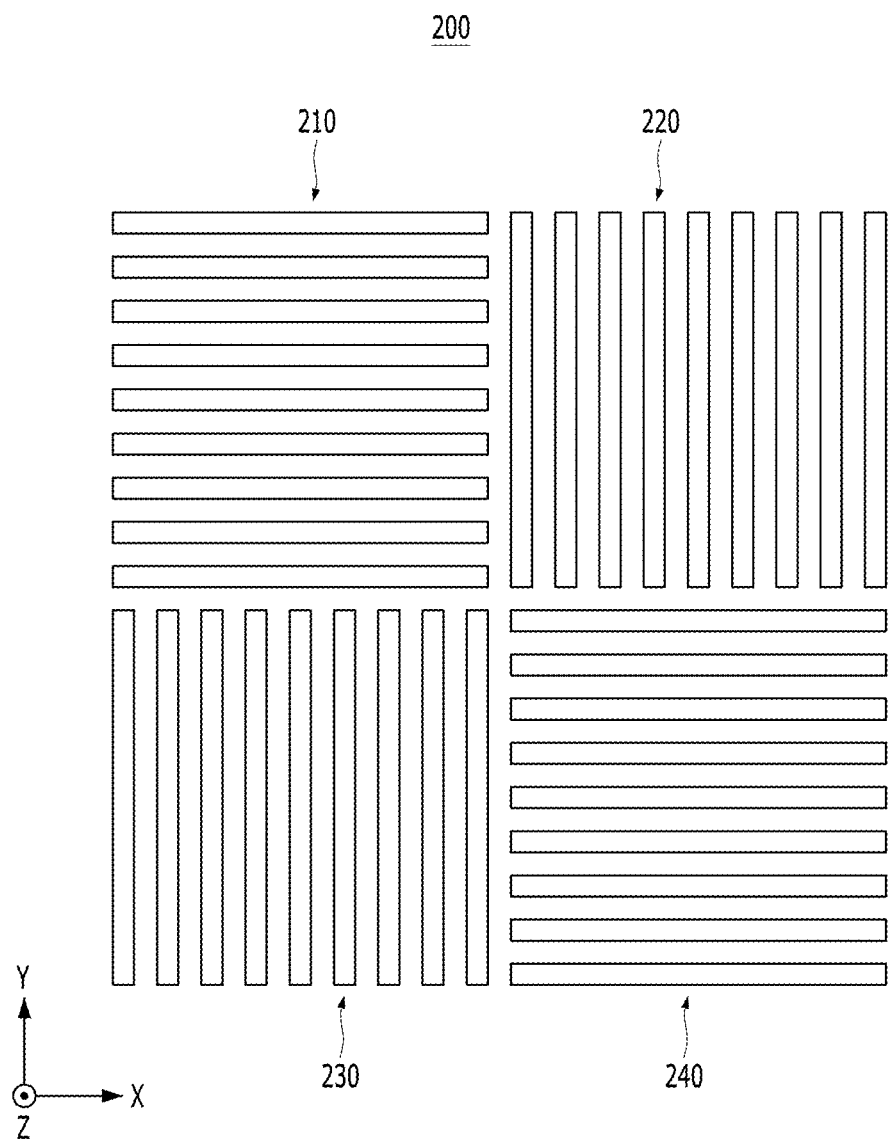
FIGS. 4 to 6 are diagrams illustrating a method of operating a semiconductor measurement apparatus according to an example embodiment.
Figure 5:
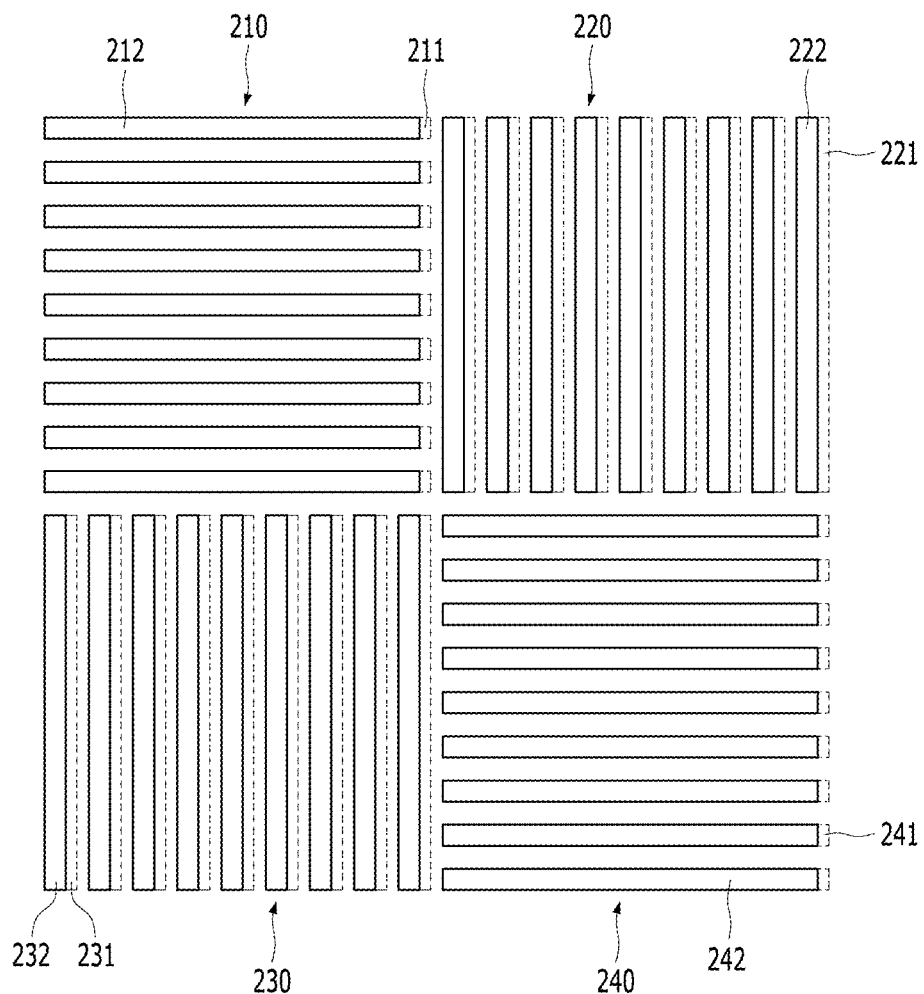
Figure 6:
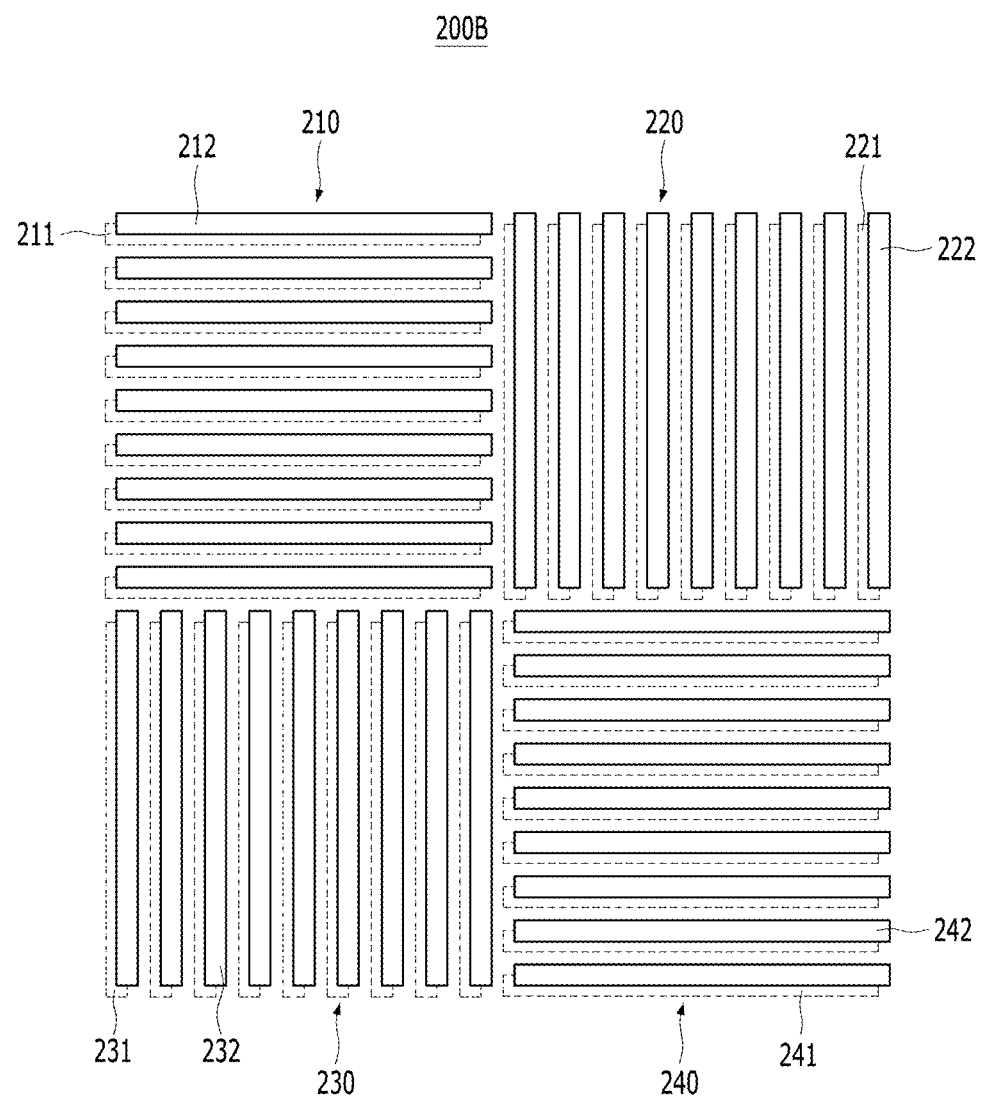

FIGS. 4 to 6 are diagrams illustrating a method of operating a semiconductor measurement apparatus according to an example embodiment.

FIGS. 4 to 6 are diagrams illustrating some patterns, among patterns formed on a sample to be measured by a semiconductor measurement apparatus, and may be schematic diagrams illustrating, for example, overlay keys 200, 200A, and 200B formed in a separation region of a wafer.

Referring to FIGS. 4 to 6, each of the overlay keys 200, 200A and 200B may include first to fourth regions 210 to 240. A plurality of patterns extending in a first direction (an X-axis direction) may be formed in each of the first and fourth regions 210 and 240, and a plurality of patterns extending in a second direction (a Y-axis direction) may be formed in each of the second and third regions 220 and 230.

Patterns, formed in the first to fourth regions 210 to 240 of each of the overlay keys 200, 200A, and 200B, may be disposed on different layers adjacent to each other in a third direction (a Z-axis direction). In the example embodiment illustrated in FIG. 4, patterns included in different layers in each of the first to fourth regions 210 to 240 of the overlay key 200 may be almost accurately aligned in the first direction and the second direction. Accordingly, when the overlay key 200 is viewed from above in the third direction, only patterns disposed to be higher in the third direction may be observed as illustrated in FIG. 4.

On the other hand, in the example embodiments illustrated in FIGS. 5 and 6, patterns formed on different layers in each of the first to fourth regions 210 to 240 of the overlay key 200A and 200B may be misaligned in at least one of the first direction and the second direction. In the example embodiment illustrated in FIG. 5, patterns formed in each of the first to fourth regions 210 to 240 of the overlay key 200A may be offset in the first direction.

Referring to the first region 210 in FIG. 5, the upper pattern 212 may be formed further to the left in the first direction than the lower pattern 211. Similarly, in each of the second to fourth regions 220 to 240, the upper patterns 222, 232, and 242 may be disposed further to the left in the first direction with respect to the lower patterns 221, 231, and 241.

In the overlay key 200B according to the example embodiment illustrated in FIG. 6, patterns formed on different layers in each of the first to fourth regions 210 to 240 may be misaligned in the first direction and the second direction. Referring to the fourth region 240 of FIG. 6, the upper pattern 242 may be offset with respect to the lower pattern 241 in a direction toward a right upper end. In each of the first to third regions 210 to 230, the upper patterns 212, 222, and 232 may be offset to the right upper end, as compared with the lower patterns 211, 221, and 231.

As described with reference to FIGS. 4 to 6, the overlay keys 200, 200A and 200B may be formed in a separation region of a wafer or the like, and a pupil image obtained by capturing the overlay keys 200, 200A and 200B may be analyzed to determine whether a process of forming the patterns has been corrected. However, the patterns of the overlay keys 200, 200A, and 200B may not be patterns providing actual circuits on a wafer, or the like, and in the overlay keys 200, 200A, and 200B, the patterns providing the actual circuits may be misaligned even when the patterns are accurately aligned. In contrast, in the overlay keys 200, 200A, and 200B, the patterns providing the actual circuit may be accurately aligned even when the patterns are misaligned.

To address the above issue, example embodiments provide a semiconductor measurement apparatus for determining an overlay from patterns providing an actual circuit. The semiconductor measurement apparatus according to an example embodiment may directly measure an alignment state of patterns formed in a semiconductor chip region of a wafer, or the like, to be involved in operation of the semiconductor chip. Accordingly, an accurate determination may be made as to whether correction is required in the process of forming the patterns.

The semiconductor measurement apparatus according to an example embodiment may also determine an alignment state of the patterns formed in the overlay keys 200, 200A and 200B, independently of the alignment state of the patterns formed in the semiconductor chip region of the wafer. As an example, the semiconductor measurement apparatus may include a first sensor, determining an alignment state of patterns formed in the semiconductor chip region, and a second sensor determining an alignment state of patterns formed on the overlay keys 200, 200A, and 200B. Accordingly, an overlay deviation depending on a location on a wafer may be determined and an MRC value may be accurately measured without a destructive inspection of the wafer, and thus, a process may be optimized.

Figure 7:
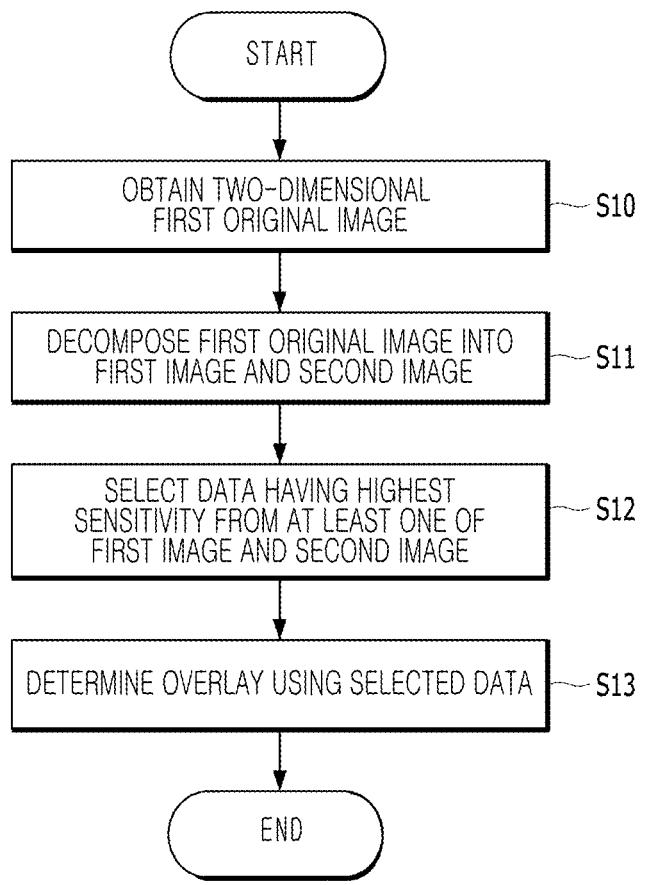
FIGS. 7 to 9 are flowcharts illustrating a method of operating a semiconductor measurement apparatus according to an example embodiment.
Figure 8:
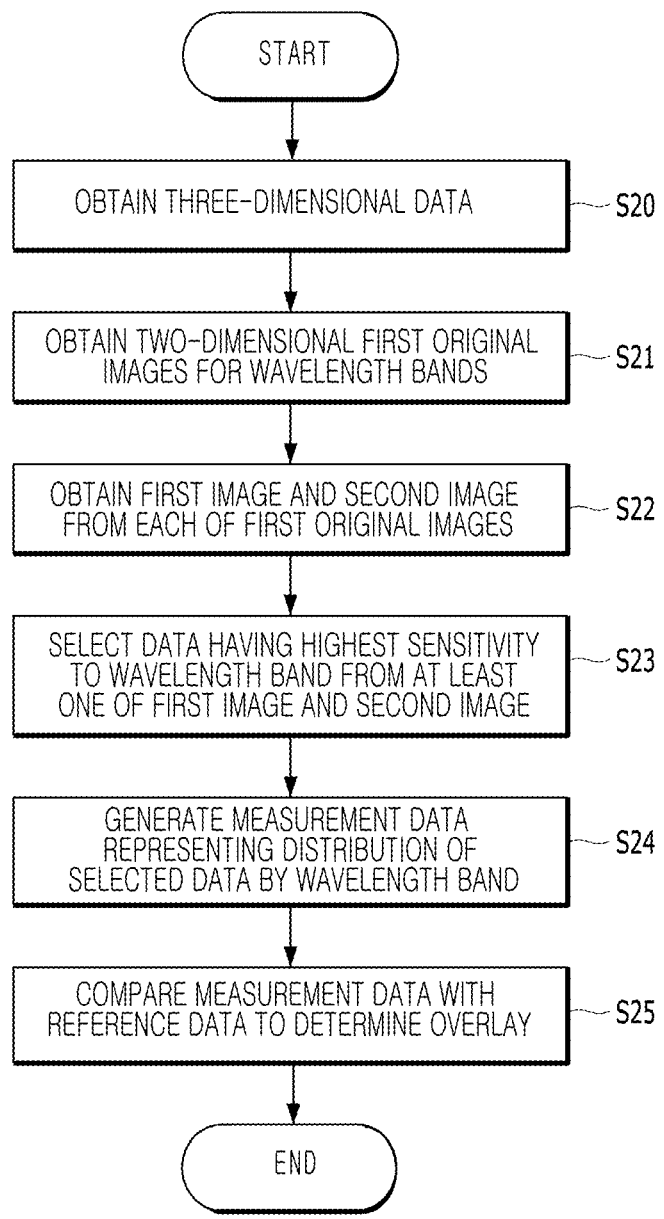
Figure 9:
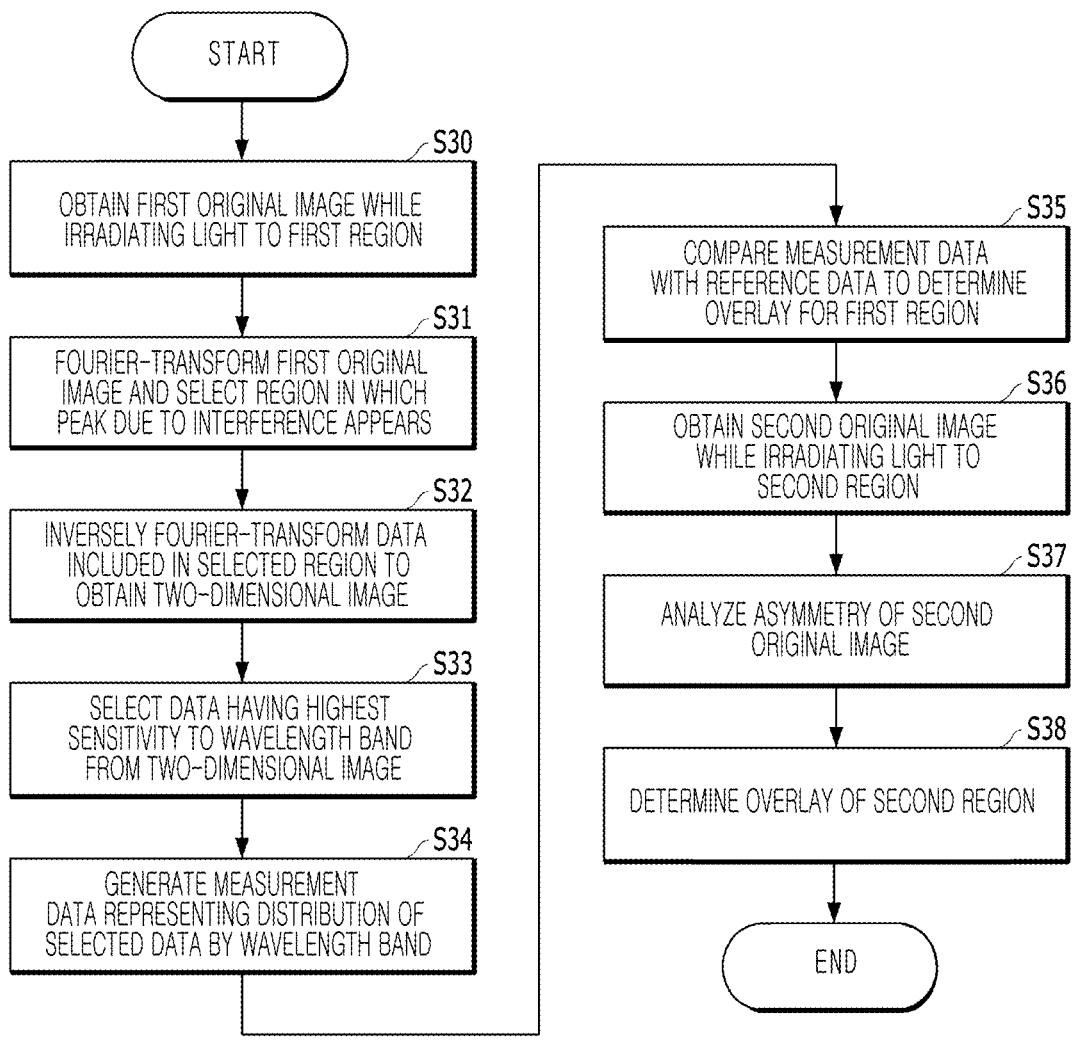

FIGS. 7 to 9 are flowcharts illustrating a method of operating a semiconductor measurement apparatus according to an example embodiment.

Referring to FIG. 7, a method of operating a semiconductor measurement apparatus according to an example embodiment may start with operation S10 in which a two-dimensional first original image is obtained. As an example, as described above with reference to FIGS. 1 and 2, the semiconductor measurement apparatus may include a first sensor including a magnetic interference generator, and the first sensor may obtain the two-dimensional first original image from light reflected from a sample.

In operation S11, the first original image generated by the first sensor may be transmitted to a controller of the semiconductor measurement apparatus, and the controller may decompose the first original image into a first image and a second image. The first sensor may include a magnetic interference generator, so the first original image may include an interference pattern of a polarization element of light reflected from the sample. The controller may decompose the first original image to generate a first image, corresponding to an intensity difference of a polarization element of light reflected from the sample, and a second image corresponding to a phase difference of the polarization element of light reflected from the sample.

In operation S12, the controller may select data having highest sensitivity from at least one of the first image and the second image. In operation S13, the controller may determine an overlay of patterns disposed in a region in which light is reflected from the sample, using the selected data. As an example, a two-dimensional plane, on which a first image corresponding to a phase difference of a polarization element of light reflected from a sample is defined, may correspond to a pupil plane of an objective lens included in the semiconductor measurement apparatus. A distribution of the intensity difference of the polarization element depending on coordinates of the two-dimensional plane, on which the first image is defined, may vary depending on an alignment state of patterns disposed in the region in which the light is reflected from the sample.

As an example, the controller may select coordinates, in which the intensity difference of the polarization element of light is largest, as data having highest sensitivity in the first image. Since the coordinates in which the intensity difference of the polarization element of light is largest varies depending on the alignment state of the patterns in a region in which the light is reflected from the sample, the controller determines an overlay corresponding to the alignment state of the patterns, using the selected data.

Referring to FIG. 8, a method of operating a semiconductor measurement apparatus according to an example embodiment may start with operation S20 in which three-dimensional data is obtained. As an example, the semiconductor measurement apparatus may generate a first original image corresponding to light reflected from a sample while an illumination apparatus irradiates light to a specific region of the sample. The semiconductor measurement apparatus may obtain a plurality of first original images while the illumination changes a wavelength band of the light irradiated to the specific region of the sample, and may obtain three-dimensional data in which the plurality of first original images are accumulated according to the wavelength band.

In operation S21, the controller may obtain first original images, respectively corresponding to wavelength bands of light output by the illumination apparatus, from the three-dimensional data. Each of the first original images may be an image defined on a two-dimensional plane, and the two-dimensional plane may be a plane corresponding to a pupil location or a pupil conjugate location of an objective lens included in the semiconductor measurement apparatus. In operation S22, the controller of the semiconductor measurement apparatus may obtain a first image and a second image from each of the first original images.

Similarly, as described above, the first image may be an image representing an intensity difference of a polarization element of light reflected from the sample, and the second image may be an image representing a phase difference of the polarization element of light reflected from the sample. When operation S22 is finished, the controller may obtain a first image and a second image corresponding to each of the wavelength bands of light. As a result, a plurality of first images and a plurality of second images may be obtained.

In operation S23, the controller may select data most sensitive to a wavelength band from at least one of the first image and the second image. As an example, the controller may select coordinates, having a largest intensity difference of a polarization element of light, in the first image, and may select coordinates, in which a largest phase difference of the polarization element of the light appears, in the second image.

For example, in the first image corresponding to light having a wavelength of 300 nm, the intensity difference of the polarization element of the light may be largest in first coordinates, and in the first image corresponding to the light having a wavelength of the 450 nm, the intensity difference of the polarization element of the light may be greatest in second coordinates, different from the first coordinates. In the first image corresponding to the light having a wavelength of 600 nm, the intensity difference of the polarization element of the light may be largest in third coordinates, and in the first image corresponding to the light having a wavelength of 750 nm, the intensity difference of the polarization element of the light is largest in fourth coordinates.

When the illumination apparatus irradiates lights, respectively having N different wavelength bands, to the sample N times, the controller may select at least N pieces of data from N first images. Also, the controller may select at least N pieces of data from N second images.

In operation S24, the controller may generate measurement data indicating a distribution of the selected data for each wavelength band. As an example, the measurement data may be spectral data defined on a coordinate axis, having wavelength bands of light output by the illumination apparatus as a horizontal axis, and a coordinate axis having a plurality of pieces of data selected from the first images and/or the second images as a vertical axis. The data selected from each of the first images and/or the second images may include a two-dimensional coordinate value, and the controller may convert the selected data into an incidence angle or an azimuthal angle of the light reflected from the sample to match the vertical axis of the coordinate axis, so that measurement data in spectral form may be generated.

A spectrum of the measurement data generated by the controller in operation S24 may vary depending on an alignment state of patterns formed in a region in which light is reflected from the sample. Accordingly, in operation S25, the controller may compare the measurement data, generated in operation S24, with reference data to determine the alignment state of the patterns, formed in the region in which the light is reflected, for example, an overlay. For example, the controller may compare the spectrum of the measurement, data generated in operation S24, with the spectrum of the reference data.

According to the method described with reference to FIG. 8, the overlay may be determined using a first original image representing an interference pattern of light across a wide incidence angle and an azimuthal angle of 360 degrees. In addition, the overlay may be determined using the first original images obtained while irradiating light having various wavelength bands. Accordingly, an overlay of patterns having minute critical dimensions or line widths may be accurately determined, and process parameters of the semiconductor process of forming the patterns may be effectively optimized, and thus, yield of the semiconductor process may be improved.

Referring to FIG. 9, a method of operating a semiconductor measurement apparatus according to an example embodiment may start with operation S30 in which a first original image is obtained while irradiating light to a first region of a sample. As an example, the first region of the sample may be a region in which devices actually involved in operation are disposed. When the sample is a wafer, the first region may be a region, among semiconductor chip regions. Patterns, providing devices actually involved in an operation, may be formed in the first region.

The first original image may be generated by the first sensor including the magnetic interference generator. In operation S31, the controller may receive the first original image, may Fourier-transform the received first original image into a frequency domain, and may select a region in which a peak caused by interference appears. In S33, the controller may inversely Fourier-transform data, included in the selected region, to obtain a two-dimensional image. In operation S33, the controller may select data having highest sensitivity to a wavelength band from a two-dimensional image. The wavelength band suggested in operation S33 may be a wavelength band of light irradiated to the first region of the sample in operation S30.

The controller may select a plurality of pieces of data having highest sensitivity to the wavelength bands of light by repeatedly performing operations S30 to S33 while changing the wavelength band of the light irradiated to the first region. In operation S34, the controller may generate measurement data representing a distribution of the plurality of pieces of data according to a wavelength band. As an example, a method of generating the measurement data may be understood with reference to the example embodiment described above with reference to FIG. 8. In operation S35, the controller may compare the measurement data, generated in operation S34, with reference data stored in a library, or the like, to determine an overlay of a first region corresponding to an alignment state of patterns formed in the first region.

In operation S36, the semiconductor measurement apparatus may irradiate light to a second region, different from the first region, to obtain a second original image. Unlike the first original image representing the interference pattern of the light reflected from the sample, the second original image may be a pupil image and may be generated by a second sensor which does not include a magnetic interference generator.

Unlike the first region, the second region may be a region in which patterns uninvolved in an actual operation, for example, an overlay key, is formed. As an example, when the sample is a wafer, the second region may be a separation region between semiconductor chip regions. In operation S37, the controller may analyze asymmetry of the second original image. In operation S38, the controller may determine an overlay of the second region, corresponding to an alignment state of patterns formed in the second region, from an analysis result.

According to the method described with reference to FIG. 9, in an example embodiment, an overlay of the first region, in which devices involved in actual operation are formed, as well as an overlay of the second region, in which an overlay key is formed, may be determined. Accordingly, a difference in the alignment state of the patterns depending on a location of the sample may be determined. Both the overlay of the first region and the overlay of the second region may be measured for patterns formed in the same semiconductor process, and an MRC value may be obtained based on the difference without destroying the sample. As an example, the MRC value may be used to correct/complement the process parameters of the semiconductor process of forming patterns and to calibrate other existing measurement apparatus for measuring only an overlay key.

Figure 10:
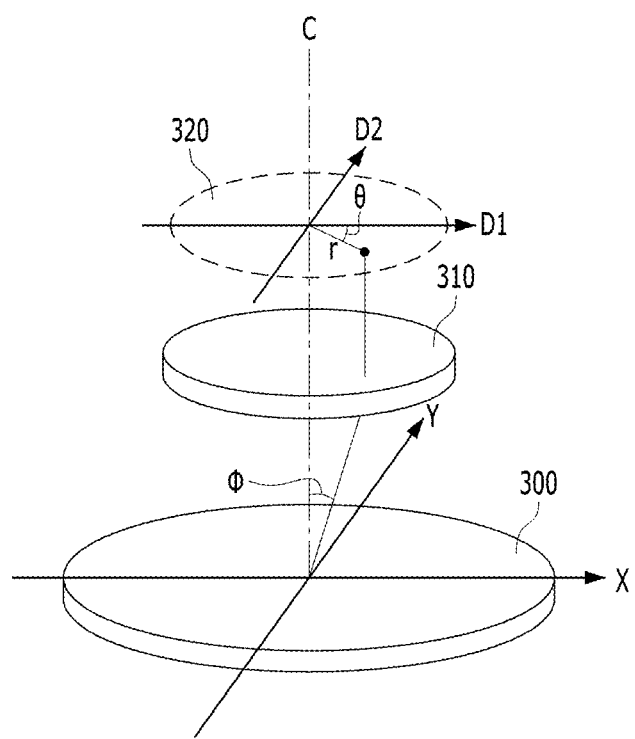
FIG. 10 is a diagram illustrating a method of operating a semiconductor measurement apparatus according to an example embodiment.

FIG. 10 is a diagram illustrating a method of operating a semiconductor measurement apparatus according to an example embodiment.

Referring to FIG. 10, light may be irradiated to a surface of a sample 300, and the surface of the sample 300 may be defined as an X-Y plane. The optical axis "C" may extend from an origin of the X-Y plane and may extend in a direction, perpendicular to the X-Y plane. The optical axis "C" may pass through a center of an objective lens 310 adjacent to the sample 300. The objective lens 310 may have a front surface, facing the sample 300, and a rear surface disposed to oppose the sample 300, and a back focal plane 320 may be defined at a desired and/or alternatively predetermined distance from the rear surface of the objective lens 310.

The back focal plane 320 may be a plane defined by a first direction D1 and a second direction D2. As an example, the first direction D1 may be the same as an X-axis direction of the surface of the sample 300, and the second direction D2 may be the same as a Y-axis direction of the surface of the sample 300. Light, passing through the objective lens 310, may be condensed on a target region of the sample 300 in the form of a dot, and may be then reflected from the target region. The reflected light may pass through the objective lens 310 and propagate to the back focal plane 320. In the semiconductor measurement apparatus according to an example embodiment, light may be allowed to be incident on the sample 300 at all azimuthal angles including 0 degrees to 360 degrees, and a range of the incidence angle φ of the light incident on the sample 300 may be determined depending on a numerical aperture (NA) of the objective lens 310.

In an example embodiment, the objective lens 310 having a numerical aperture of 0.9 or more to less than 1.0 may be employed in the semiconductor measurement apparatus such that data on a wide range of incidence angle may be obtained by a single capturing operation. In this case, a maximum incidence angle of the light, passing through the objective lens 310, may be 65 degrees or more, and may be less than 90 degrees.

When each coordinates included in the back focal plane 320 defined in the first direction D1 and the second direction D2 is expressed as polar coordinates (r, θ), first coordinate "r" may be determined by an incidence angle φ, as illustrated in FIG. 10. On the other hand, second coordinates "θ" is a value representing how much the coordinates rotates in the first direction D1, and thus, may be the same as an azimuthal angle of light incident on the sample 300 and may have a value of 0 degrees to 360 degrees.

In the semiconductor measurement apparatus according to an example embodiment, data including an interference pattern having an incidence angle range determined depending on an azimuthal angle of 0 degrees to 360 degrees and a numerical aperture of the objective lens 310 may be obtained in an image format by a single capturing operation performed while light is reflected in the target region of the sample 300. In addition, the light passing through the objective lens 310 may be condensed and irradiated to the surface of the sample 300 in the form of a dot, so that an alignment state of patterns included in the target region of the sample 300 may be captured with high resolution, unlike a method of irradiating light in a direction inclined direction to the surface of the sample 300 according to the related art. Accordingly, the semiconductor measurement apparatus according to an example embodiment may accurately determine an overlay of patterns of actual devices having relatively small critical dimensions and line widths, as compared with patterns of an overlay key formed in a separation region.

Figure 11:
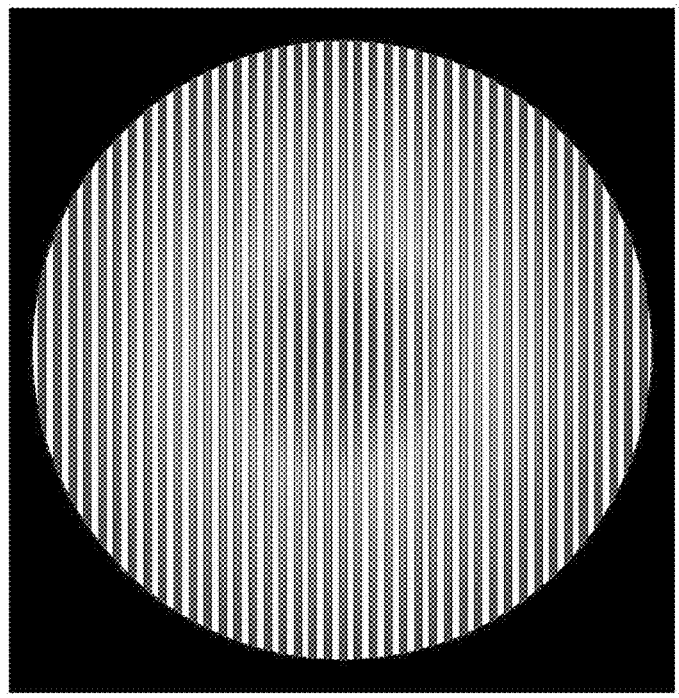
FIG. 11 is a schematic diagram of an original image obtained by a semiconductor measurement apparatus according to an example embodiment.
Figure 12A:
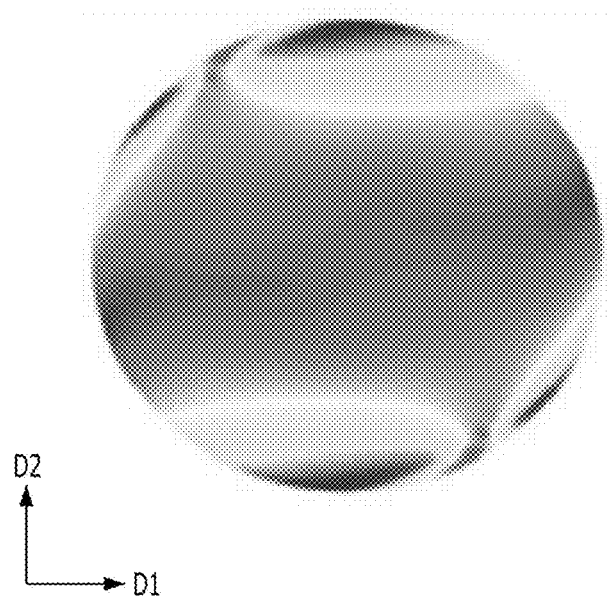
FIGS. 12A and 12B are diagrams illustrating a first image and a second image obtained from the original image by the semiconductor measurement apparatus according to an example embodiment.
Figure 12B:
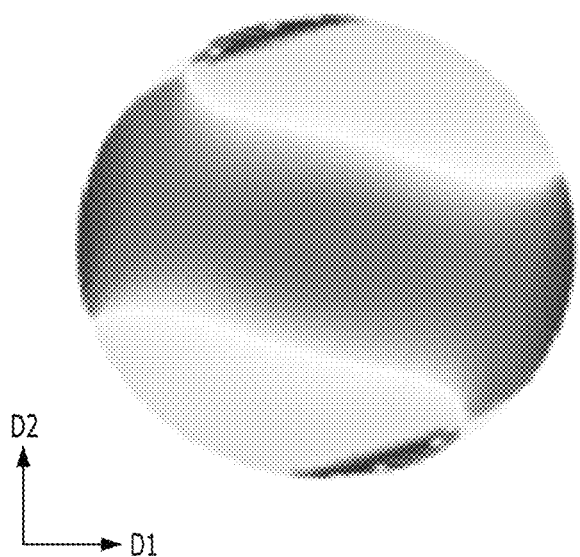

FIG. 11 is a schematic diagram of an original image obtained by a semiconductor measurement apparatus according to an example embodiment, and FIGS. 12A and 12B are diagrams illustrating a first image and a second image obtained from the original image by the semiconductor measurement apparatus according to an example embodiment.

The original image 330 according to the example embodiment illustrated in FIG. 11 may be an image obtained by a first sensor including a magnetic interference generator, among sensors included in the semiconductor measurement apparatus, through a single capturing operation. The first sensor may further include a first image sensor in addition to the magnetic interference generator. The original image 330 may be expressed in a first direction D1 and a second direction D2 defining a surface of a sample on which the light is reflected, and data of each pixel included in the original image 330 may be determined by an azimuthal angle and an incidence angle of light.

The original image 330 may include an interference pattern of light irradiated to the sample and then reflected therefrom. Therefore, a first parameter $\Psi$ and a second parameter $\Delta$, required to determine critical dimensions of structures included in the sample by ellipsometry, may be obtained using the original image 330. As an example, the first parameter $\Psi$ may correspond to an intensity difference of a polarization element of the light reflected from the sample, and the second parameter $\Delta$ may correspond to a phase difference of the polarization element of light reflected from the sample. A controller of the semiconductor measurement apparatus according to an example embodiment may extract a first image 331, representing the first parameter $\Psi$, and a second image 332, representing the second parameter $\Delta$, from the original image 330.

As illustrated in FIGS. 12A and 12B, each of the first image 331 and the second image 332 may be an image expressed in a first direction D1 and an image expressed in a second direction D2, similarly to the original image 330. The first image 331 may be an image generated by matching an intensity difference of signals, incident on the first image sensor of the first sensor, with coordinates corresponding to an incidence angle and an azimuthal angle of light incident on the sample. The second image 332 may be an image generated by matching a phase difference between signals, incident on the first image sensor of the first sensor with the coordinates corresponding to the incidence angle and the azimuthal angle of the light incident on the sample.

As an example, two linearly polarized signals, perpendicular to each other, may be polarized by 45 degrees by a polarization element disposed on a front end of the image sensor in the semiconductor measurement apparatus. The first image 331 may be an image in which an intensity ratio of linearly polarized signals polarized by the polarization element is expressed according to an incidence angle and an azimuthal angle, and the second image 332 may be an image in which a phase difference between the linearly polarized signals polarized by the polarization element is expressed according to the incidence angle and the azimuthal angle.

In the example embodiment described with reference to FIGS. 11, 12A and 12B, the original image 330 and the first image 331 and the second image 332 extracted from the original image 330 may be images obtained while the illumination apparatus of the semiconductor measurement apparatus irradiates light having a specific wavelength band to a sample. The wavelength band of the light irradiated to the sample by the illumination apparatus may be a wavelength band having high sensitivity to an alignment state of patterns formed in a region to which the light is irradiated from the sample. The semiconductor measurement apparatus may obtain the first image 331 and the second image 332 from the original image 330 generated while irradiating light of a wavelength band having high sensitivity to the alignment state of the patterns, and may determine the alignment state of the patterns using the coordinates of the pixel having largest data in the first image 331 and/or the second image 332.

In an example embodiment, the illumination apparatus may irradiate light having a wavelength band of a desired and/or alternatively predetermined range, rather than light of a specific wavelength band, to the sample and the controller may generate three-dimensional data including images representing an interference pattern of light in a wavelength band of a corresponding range. Hereinafter, it will be described with reference to FIGS. 13A and 13B.

Figure 13A:
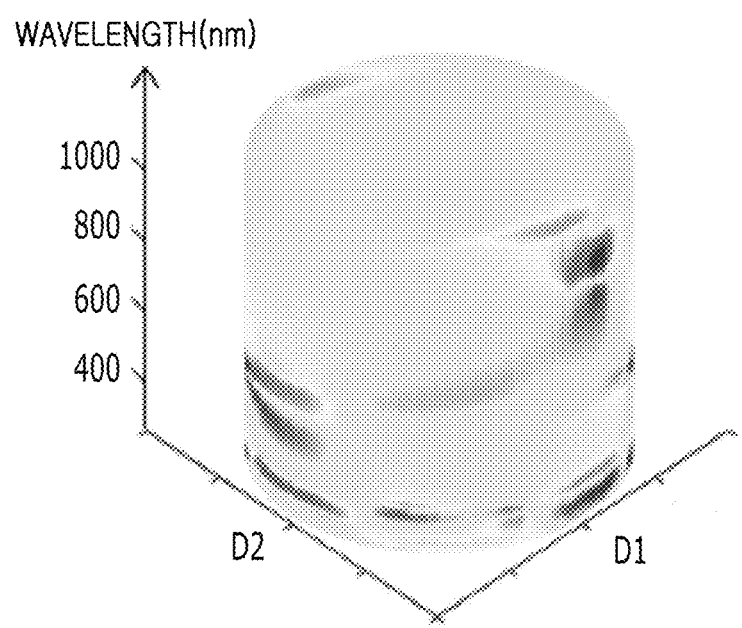
FIGS. 13A and 13B are diagrams illustrating a method of operating a semiconductor measurement apparatus according to an example embodiment.
Figure 13B:
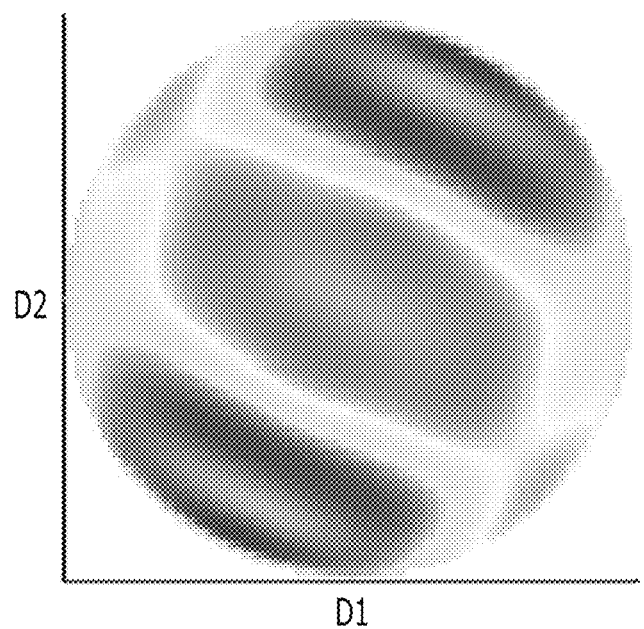

FIGS. 13A and 13B are diagrams illustrating a method of operating a semiconductor measurement apparatus according to an example embodiment.

Referring to FIG. 13A, a controller of a semiconductor measurement apparatus according to an example embodiment generates three-dimensional data using first original images output by a first image sensor of a first sensor including a magnetic interference generator. The three-dimensional data may include first original images obtained by imaging an interference pattern of polarization elements of light incident on the first image sensor, and the first original images may be arranged according to a wavelength band of light irradiated to a sample. Accordingly, as illustrated in FIG. 13A, the three-dimensional data may be generated in a space including a first direction D1 and the second direction D2, defining a surface of the sample to which light is irradiated, and a third direction D3 corresponding to a wavelength band of the light.

The controller of the semiconductor measurement apparatus may determine an alignment state of patterns included in a region in which light is reflected from the sample in various manners using the three-dimensional data. As an example, the controller may decompose each of the first original images into a first image, corresponding to an intensity difference of a polarization element of light, and a second image corresponding to a phase difference of the polarization element of the light. Accordingly, the controller may obtain a plurality of first images and a plurality of second images. As an example, the first original image corresponding to a specific wavelength band may be an image on a two-dimensional plane defined in the first direction D1 and the second direction D2 as illustrated in FIG. 13B.

The controller may select data having highest sensitivity from at least one of the first image and the second image. As an example, coordinates of a pixel having a largest intensity difference of the polarization element of light in the first image may be selected as data, or coordinates of a pixel having a largest phase difference of the polarization element of light in the second image may be selected as data.

The controller may arrange a plurality of pieces of data, respectively selected from the plurality of first images, according to a wavelength band or may arrange a plurality of pieces of data, respectively selected from the plurality of second images, according to a wavelength band to obtain spectrum-type measurement data. The controller may compare previously generated reference data of a library with the measurement data to determine whether patterns formed on different layers in a region, in which the light is reflected, are well aligned with each other, and/or to determine how offset the patterns are.

Figure 14:
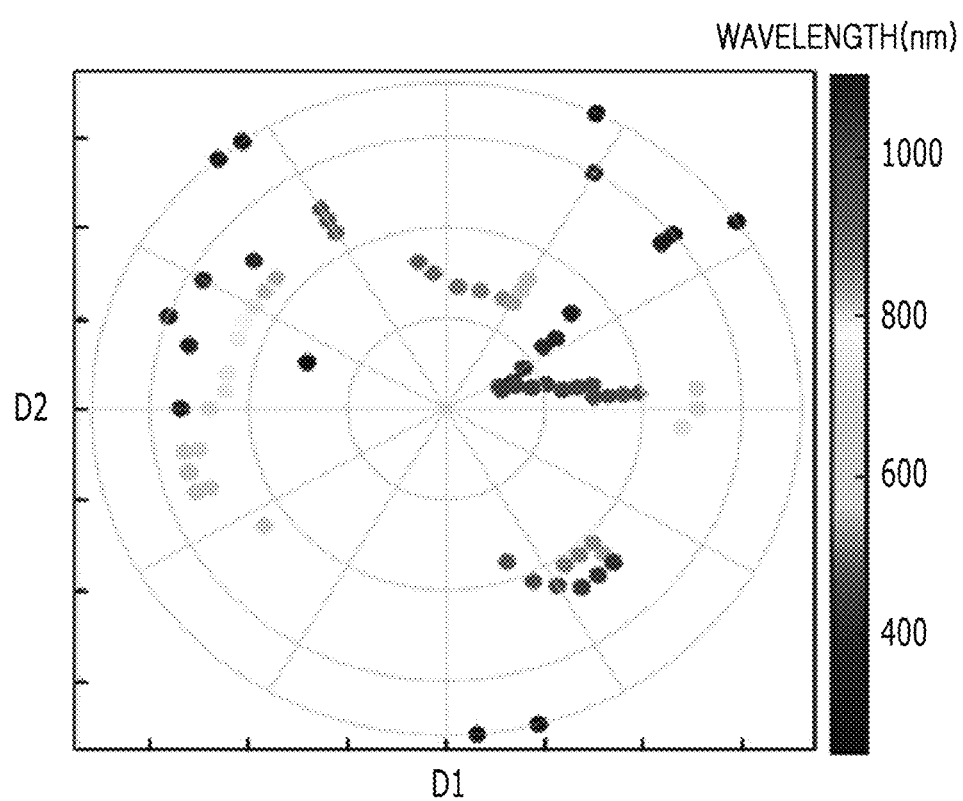
FIGS. 14 and 15 are diagrams illustrating a method of operating a semiconductor measurement apparatus according to an example embodiment.
Figure 15:
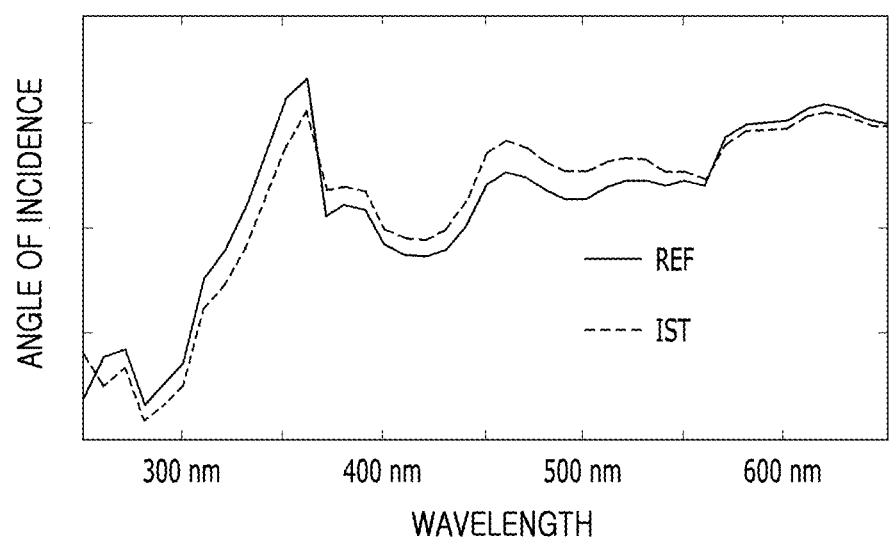

FIGS. 14 and 15 are diagrams illustrating a method of operating a semiconductor measurement apparatus according to an example embodiment.

FIG. 14 may be a diagram in which a plurality of pieces of data selected from a plurality of first images are displayed in a single image. As an example, each of the plurality of first original images, included in the three-dimensional data described with reference to FIG. 13A, may be decomposed to obtain a plurality of first images representing an intensity difference of a polarization element of light. Each of the plurality of first images may represent an intensity difference of a polarization element of light of a specific wavelength band when the light is reflected from a sample. However, the example embodiment described with reference to FIGS. 14 and 15 may be similarly applied to a plurality of second images representing a phase difference of the light reflected from the sample.

A controller of a semiconductor measurement apparatus may select data, having highest sensitivity to a wavelength band of the light reflected from the sample, from each of the plurality of first images. As an example, the data selected by the controller may be coordinates of a pixel in which a difference of a polarization element of light is largest in each of the plurality of first images. Referring to FIG. 14, the coordinates, data selected from each of a plurality of first images by the controller, may be distributed in various manners according to a wavelength band of light reflected by the sample.

The controller may generate measurement data representing a distribution of data according to a wavelength band of light, and may compare the measurement data with reference data to determine an alignment state of patterns formed in adjacent layers in a region in which light is reflected. As an example, as illustrated in FIG. 15, the controller may generate the spectrum-type measurement data IST representing a distribution of data according to the wavelength band of light, and may compare the measurement data IST with reference data REF.

As described above, in each of the plurality of first images, the controller may select, as data, coordinates of a pixel having the largest intensity difference of a polarization element of light. However, the coordinates of the pixel may include two coordinate values, and may be inappropriate for generation of the measurement data IST as illustrated in FIG. 15.

In an example embodiment, the controller may convert coordinates of a pixel into an incidence angle of light, reflected from the sample, to generate measurement data IST as illustrated in FIG. 15. A two-dimensional plane, on which each of the plurality of first images is expressed, may correspond to a plane including a surface of the sample. As described above with reference to FIG. 10, coordinates of the plane including the surface of the sample may be determined by an incidence angle and an azimuthal angle. The controller may convert coordinates of a pixel, selected from each of the plurality of first images, into an incidence angle to generate spectrum-type measurement data IST, and may compare the measurement data IST with the reference data REF to determine an alignment state of patterns.

In the example embodiment illustrated in FIG. 15, the reference data REF may be obtained by the semiconductor measurement apparatus when patterns, disposed in a region in which the light is reflected, are accurately aligned. Meanwhile, the measurement data IST may be obtained by the semiconductor measurement apparatus when the patterns, disposed in the region in which light is reflected, are misaligned by a desired and/or alternatively predetermined offset. The measurement data IST according to the example embodiment illustrated in FIG. 15 may be obtained by the semiconductor measurement apparatus when patterns are offset by 1 nm.

As described with reference to FIG. 15, the semiconductor measurement apparatus according to an example embodiment may obtain measurement data IST having a significantly different distribution, as compared with the reference data REF, even when patterns are misaligned by several nanometers. Accordingly, a semiconductor measurement apparatus for accurately determining even an alignment state of patterns, formed in the semiconductor chip region and involved in actual operation, may be implemented.

FIGS. 16A, 16B, 17A, 17B, 18A, and 18B are diagrams illustrating a method of operating a semiconductor measurement apparatus according to an example embodiment.

FIGS. 16A, 16B, 17A, 17B, 18A, and 18B may be diagrams illustrating a method of determining an alignment state of patterns formed in a second region of a sample. As an example, the second region of the sample may be a separation region for separating actually operating semiconductor chip regions, and may be a region for performing a scribing process, or the like, when the sample is a wafer.

Figure 16A:
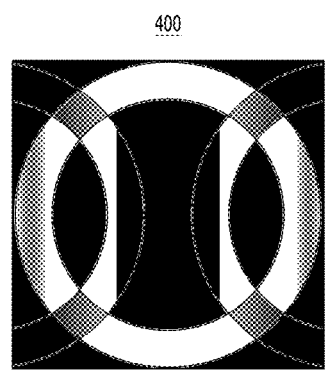
FIGS. 16A, 16B, 17A, 17B, 18A, and 18B are diagrams illustrating a method of operating a semiconductor measurement apparatus according to an example embodiment.
Figure 16B:
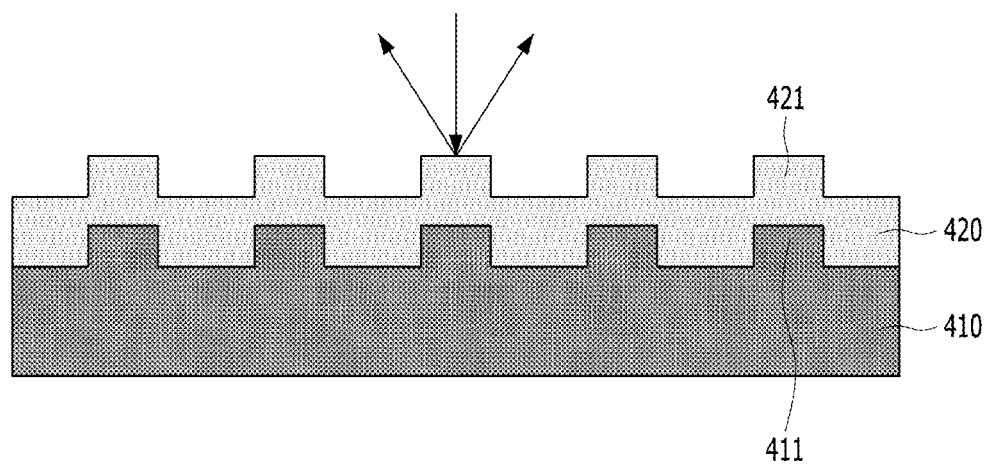

An overlay key for determining an alignment state of patterns formed by a semiconductor process may be formed in the second region of the sample. Referring to FIGS. 16A and 16B, the sample may include a first layer 410 and a second layer 420 stacked on each other, and first patterns 411 may be formed on the first layer 410 and second patterns 421 may be formed on the second layer 420. In an example embodiment illustrated in FIGS. 16A and 16B, the first patterns 411 and the second patterns 421 may be accurately aligned without being offset in a specific direction.

The semiconductor measurement apparatus may determine an alignment state of the first patterns 411 and the second patterns 421 using a shape in which an opening in a pupil conjugate position of an illumination apparatus, irradiating light to the sample, may be imaged in a pupil image. As an example, the semiconductor measurement apparatus may include a second sensor which does not include a magnetic interference generator, and the second sensor may generate a second original image 400 corresponding to the pupil image and may output the second original image 400 to the controller.

In the example embodiment illustrated in FIGS. 16A and 16B, the first patterns 411 and the second patterns 421 may be accurately aligned. Accordingly, a shape of the opening in the second original image 400 may be expressed to be bilaterally symmetric. The controller of the semiconductor measurement apparatus may analyze symmetry of the second original image 400 to determine an overlay of the region in which light is reflected from the sample.

Figure 17A:
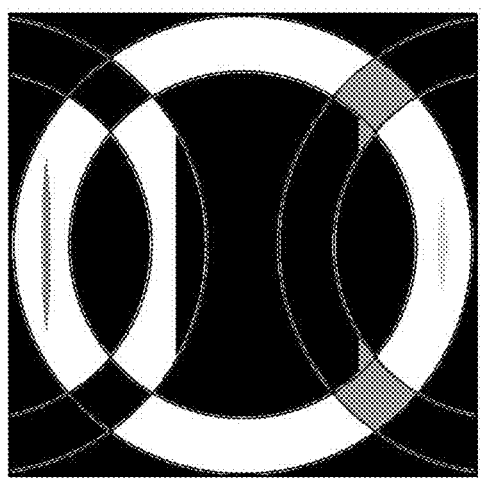
Figure 17B:
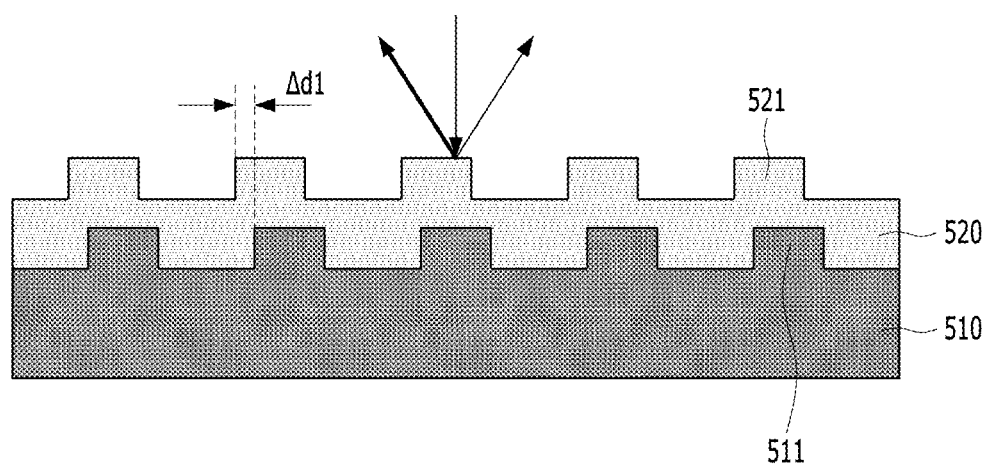

Referring to FIGS. 17A and 17B, the sample may include a first layer 510 and a second layer 520 stacked vertically, and first patterns 511 are formed on the first layer 510 and second patterns 521 may be formed on the second layer 520. In the example embodiment illustrated in FIGS. 17A and 17B, the first patterns 511 and the second patterns 521 may be offset in a left direction. As an example, as compared with the example embodiment illustrated in FIG. 16B, in the example embodiment illustrated in FIG. 17B, the second pattern 521 may be formed to be offset to the left by a desired and/or alternatively predetermined first offset Δd1 with reference to the first pattern 511.

The semiconductor measurement apparatus may determine an alignment state of the first patterns 511 and the second patterns 521 using the shape of the opening appearing in the second original image 500. In the example embodiment illustrated in FIGS. 17A and 17B, the first patterns 511 may be formed to be more offset to a left side than the second patterns 521, so that light may be reflected to be asymmetrical with respect to an optical axis in the left and right directions. Accordingly, a higher contrast may appear on the left side of the second original image 500 as illustrated in FIG. 17A.

The controller of the semiconductor measurement apparatus may analyze the symmetry of the second original image 500 to determine an overlay of the region in which the light is reflected from the sample. In the example embodiment illustrated in FIG. 17A, the left side of the second original image 500 may appear darker than the right side. The semiconductor measurement apparatus may determine a direction and a magnitude of the first offset Δd1 representing an alignment state of the patterns 511 and 521 based on a difference in shade between left and right sides.

Figure 18A:
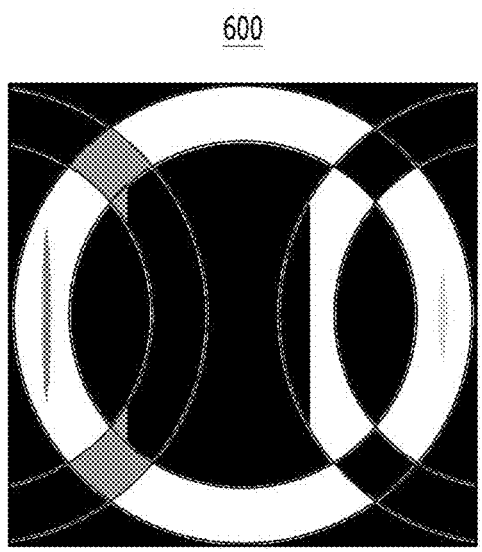
Figure 18B:
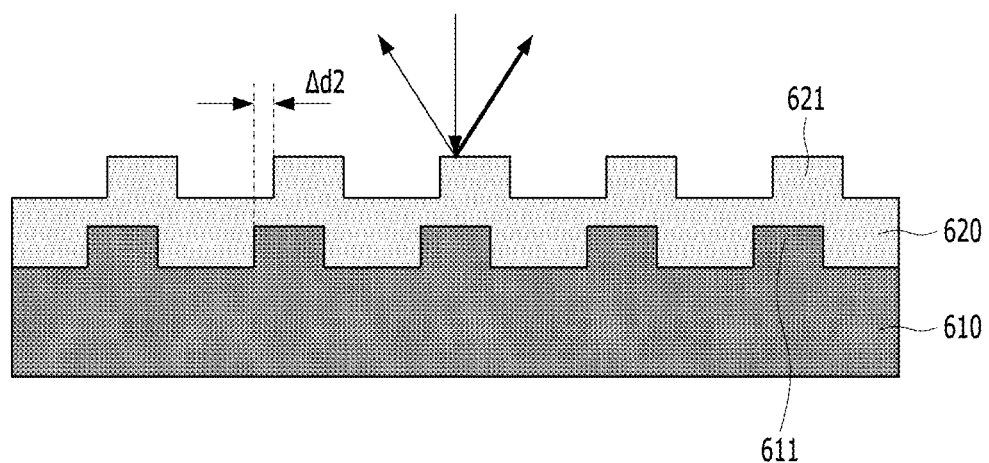

Referring to FIGS. 18A and 18B, a sample may include a first layer 610 and a second layer 620 stacked vertically, and first patterns 611 may be formed on the first layer 610 and second patterns 621 may be formed on the second layer 620. In the example embodiment illustrated FIGS. 18A and 18B, the first patterns 511 and the second patterns 521 may be offset in a right direction. As an example, as compared with the example embodiment illustrated in FIG. 16B, in the example embodiment illustrated in FIG. 18B, the second patterns 621 may be formed to be offset to a right side by a second offset Δd2 with respect to the first patterns 611.

The semiconductor measurement apparatus may determine an alignment state of the first patterns 611 and the second patterns 621 using the shape of the opening illustrated in the second original image 600. In the example embodiment illustrated in FIGS. 18A and 18B, the first patterns 611 may be formed to be more offset to a left side than the second patterns 621, so that light may be reflected to be asymmetrical with respect to an optical axis in the left and right directions. For example, light reflected to the right with respect to the optical axis may have higher intensity. Accordingly, a higher contrast may appear on a right side of the second original image 600 as illustrated in FIG. 18A.

The controller of the semiconductor measurement apparatus may analyze the symmetry of the second original image 600 in the left and right directions to determine an overlay of the region in which the light is reflected from the sample. In the example embodiment illustrated in FIG. 18A, the left side of the second original image 600 may have a lower contrast than the right side. The semiconductor measurement apparatus may determine a direction and a magnitude of the second offset Δd2, representing an alignment state of the patterns 611 and 621, based on the difference in shade between the left and right sides.

Figure 19:
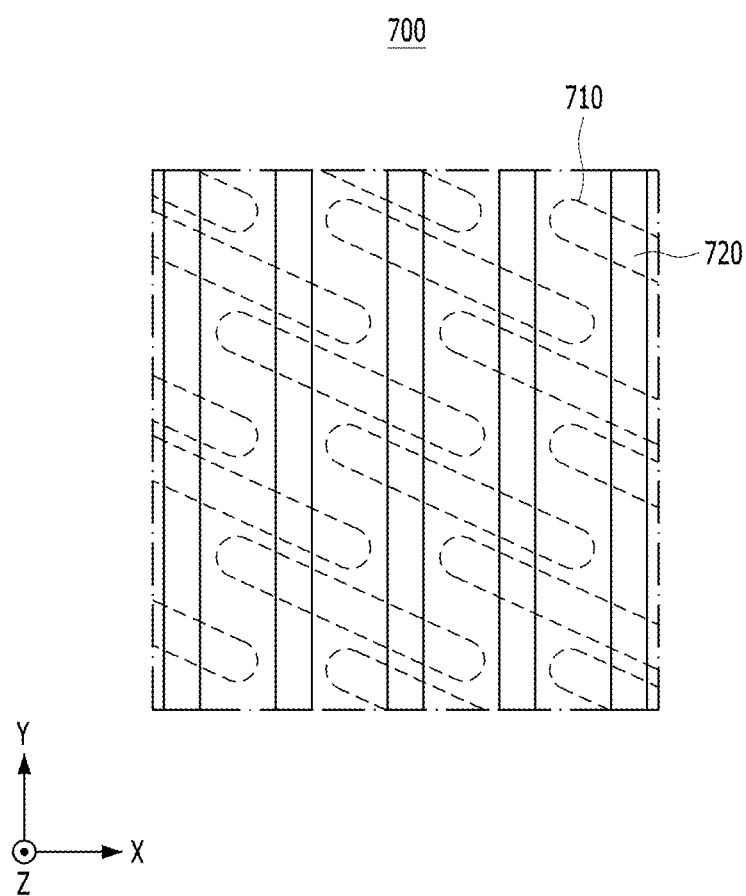
FIGS. 19 and 20 are schematic diagrams illustrating a sample in which an overlay may be determined by a semiconductor measurement apparatus according to an example embodiment.
Figure 20:
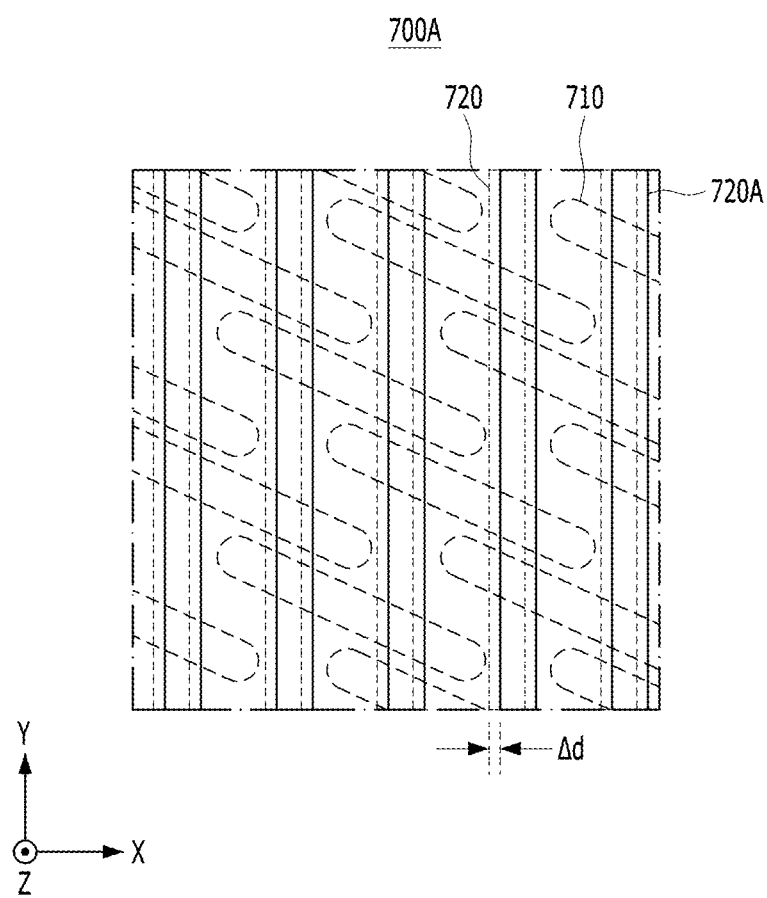

FIGS. 19 and 20 are schematic diagrams illustrating a sample in which an overlay may be determined by a semiconductor measurement apparatus according to an example embodiment.

Referring to FIG. 19, a sample according to an example embodiment may be a wafer 700 including a plurality of semiconductor chip regions and a separation region therebetween, and patterns for providing a plurality of semiconductor devices 710 and 720 may be formed in each of the plurality of semiconductor chip regions. As an example, in the example embodiment illustrated in FIG. 19, a semiconductor device manufactured on the wafer 700 may be a dynamic random access memory (DRAM) device.

Referring to FIG. 19, a plurality of active regions 710 extending in a direction, intersecting a first direction (an X-axis direction) and a second direction (a Y-axis direction), and a plurality of gate structures 720 extending in the second direction may be formed on a wafer 700. The plurality of active regions 710 may be formed by an ion implantation process of implanting impurities into a semiconductor substrate of the wafer 700, and the plurality of first gate structures 720 may be formed to be buried in the semiconductor substrate. Each of the plurality of active regions 710 may provide a pair of semiconductor devices together with a pair of first gate structures 720. Each of the semiconductor devices, provided by the plurality of active regions 710 and the plurality of first gate structures 720, may provide a switching device included in a memory cell.

Referring to FIG. 19, the plurality of first gate structures 720 may be accurately formed in desired locations. Meanwhile, in the example embodiment illustrated in FIG. 20, a plurality of second gate structures 720A may be misaligned by a desired and/or alternatively predetermined offset Δd in a first direction. Referring to FIG. 20, each of the plurality of second gate structures 720A may be formed to shift to a right side by an offset Δd, as compared with a plurality of first gate structures 720 in an accurately aligned state.

In the example embodiments described with reference to FIGS. 19 and 20, the first gate structures 720 may be formed in the first region of the wafer 700, and the second gate structures 720A may be formed in the second region of the wafer 700. For example, overlays of the gate structures 720 and 720A may be different from each other in the first region and the second region disposed at different locations in a single wafer 700.

In general, an overlay is measured from an additional overlay key formed in a separation region, rather than patterns involved in an actual operation. Therefore, it may be difficult to accurately determine an overlay difference in the semiconductor chip region based on only an alignment state of the overlay key. On the other hand, according to an example embodiment, an overlay of the patterns formed on the semiconductor chip region may be directly determined without inferring from the overlay key. In addition, light may be irradiated in a direction, perpendicular to a surface of the wafer 700, and the overlay of the patterns formed in the semiconductor chip region may be measured using an image representing an interference pattern of the reflected light, so that even a significantly fine offset Δd may be accurately measured.

Figure 21:
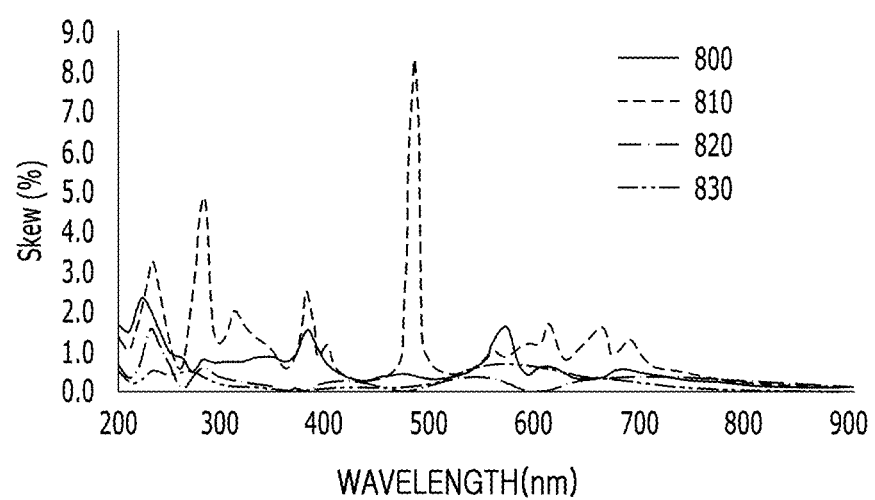
FIG. 21 is a diagram a method of operating a semiconductor measurement apparatus according to an example embodiment.

FIG. 21 is a diagram of a method of operating a semiconductor measurement apparatus according to an example embodiment.

In FIG. 21, each of a first graph 810 and a second graph 820 may be a graph illustrating a skew between a plurality of pieces of measurement data and a plurality of pieces of reference data generated by a semiconductor measurement apparatus according to an example embodiment using light reflected from a sample including misaligned patterns. Each of a third graph 830 and a fourth graph 840 may be a graph illustrating a skew between a plurality of pieces of measurement data, obtained in such a manner that light is irradiated to a surface of the sample in a direction inclined by a specific incidence angle to measure an alignment state of patterns, and reference data.

In an example embodiment, the semiconductor measurement apparatus may irradiate light in a direction, perpendicular to the surface of the sample, and may obtain a first original image representing an interference pattern of a polarization element of reflected light. As an example, light irradiated to the sample may pass through an objective lens having a large numerical aperture of 0.9 or more. The semiconductor measurement apparatus may obtain a first image, representing an intensity difference of a polarization element of light, and a second image, representing a phase difference of the polarization element of the light, from the first original image.

The semiconductor measurement apparatus may obtain a plurality of first original images while changing a wavelength band of light, and thus, a plurality of first images and a plurality of second images may also be generated. The semiconductor measurement apparatus may select data having highest sensitivity from each of the plurality of first images and the plurality of second images, and may generate measurement data representing a distribution of a plurality of pieces of data selected for each wavelength band.

In the embodiment illustrated in FIG. 21, a first graph 810 may be a graph illustrating a difference between measurement data, representing a distribution for each wavelength band of a plurality of pieces of data selected from a plurality of first images, and reference data after comparing the measurement data and the reference data with each other. A second graph 820 may be a graph illustrating a difference between measurement data, representing a distribution for each wavelength band of a plurality pf pieces of data selected from a plurality of second images, with reference data after comparing the measurement data and the reference data with each other.

As illustrated in FIG. 21, in the semiconductor measurement apparatus according to an example embodiment, a difference between reference data and measurement data may be large. As an example, referring to the first graph 810, the measurement data and reference data obtained using an intensity difference of a polarization element of light reflected from a sample may have a significantly large difference in a specific wavelength band in the vicinity of specific wavelength bands, for example, a wavelength band around 300 nm and a wavelength band around 500 nm. On the other hand, in the third graph 830 and the fourth graph 840, a difference between the reference data and the measurement data may be small in the entire wavelength band.

As described above, the semiconductor measurement apparatus according to an example embodiment may obtain a first original image, representing an interference pattern of polarization elements of light reflected from a sample, and a second original image corresponding to a pupil image of the light reflected from the sample. As an example, a first image representing an intensity difference of a polarization element of the light and a second image representing a phase difference of the polarization element of the light may be generated from the first original image. The semiconductor measurement apparatus may obtain a plurality of first original images while changing a wavelength band of light, and may extract a plurality of first images and a plurality of second images from the plurality of first original images.

The semiconductor measurement apparatus may select data having highest sensitivity from each of the plurality of first images, and may generate first measurement data representing a distribution of a plurality of pieces of selected data for each wavelength band. The semiconductor measurement apparatus may compare the first measurement data with first reference data previously stored in a library, or the like, to determine an alignment state of patterns. Similarly, the semiconductor measurement apparatus may select data having highest sensitivity from each of the plurality of second images and may compare second measurement data, representing a distribution of a plurality of pieces of selected data for each wavelength band, with second reference data to determine an alignment state of patterns. The first reference data and the second reference data may be different from each other.

The plurality of first original images may be used to determine an alignment state of patterns included in a semiconductor device and involved in an actual operation. On the other hand, the plurality of second original images may be used to determine an alignment state of an overlay key formed in a separation region, which is not included in the semiconductor device, or the like. Accordingly, an alignment state of the overlay key as well as an overlay of the patterns inside the semiconductor device may be determined by a single semiconductor measurement apparatus, and an MRC value representing an overlay difference depending on a location on a wafer may be obtained without an additional destructive inspection.

As described above, an overlay of patterns additionally formed in a separation region for determining an overlay as well as an overlay of patterns formed in a semiconductor chip region to provide an actually operating circuit may be directly determined to accurately determine an alignment state of patterns formed by a semiconductor process. In addition, a first image representing an intensity difference of a polarization element and a second image representing a phase difference of the polarization element may be obtained from an original image, in which a sample is captured at a wide azimuthal angle and a wide incident angle, and an overlay may be determined using at least one of the first image and the second image. Accordingly, an alignment state of the patterns may be measured with high sensitivity.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

For example, the controller 50 may operate in response to instructions, signals, commands, and/or information input thereto, thereby transforming the controller 50 into a special-purpose controller for controlling the semiconductor measuring apparatus to perform operations in example embodiments of the present disclosure.

While example embodiments have been shown and described above, it will be apparent to those skilled in the art that modifications and variations could be made without departing from the scope of inventive concepts as defined by the appended claims.

What is claimed is:

1. A semiconductor measurement apparatus comprising:
   an illumination apparatus including a light source and a polarizer, the light source configured to output light, the polarizer disposed on a propagation path of light output from the light source;
   an optical assembly including an objective lens and a beam splitter,
   the objective lens configured to allow light passing through the polarizer to be incident on a sample, and
   the beam splitter configured to transmit light reflected from the sample to a first sensor and a second sensor; and
   a controller,
   the controller configured to determine an alignment state of patterns included in a first region of the sample using a first original image output by the first sensor, and
   the controller configured to determine an alignment state of patterns included in a second region of the sample using a second original image output by the second sensor, wherein
   the first sensor includes a first image sensor and a self-interference generator disposed in a path along which light is incident on the first image sensor, and the second sensor includes a second image sensor, and
   the controller obtains a first image and a second image from the first original image, the first image represents an intensity difference of a polarization element of light reflected from the sample, and the second image represents a phase difference of the polarization element of the light reflected from the sample, and the controller determines the alignment state of patterns, included in the first region, using at least one of the first image and the second image.

2. The semiconductor measurement apparatus of claim 1, wherein the sample includes a plurality of semiconductor chip regions and a separation region between the plurality of semiconductor chip regions; and the first region is disposed in at least one of the plurality of semiconductor chip regions, and the second region is disposed in the separation region.

3. The semiconductor measurement apparatus of claim 1, wherein the first sensor is configured to generate the first original image, representing an interference pattern of light, on a two-dimensional plane defined in a location of a pupil of the objective lens.

4. The semiconductor measurement apparatus of claim 1, wherein the first original image includes a plurality of first original images, and the controller is configured to change a wavelength band of light output by the illumination apparatus, and the controller is configured to obtain the plurality of first original images and determine an alignment state of patterns included in the first region using a spectrum generated using the plurality of first original images.

5. The semiconductor measurement apparatus of claim 4, wherein the controller is configured select data having highest sensitivity to at least one of an intensity difference of a polarization element of light reflected from the sample and a phase difference of the polarization element of the light reflected from the sample in each of the plurality of first original images, and the controller is configured to generate the spectrum.

6. The semiconductor measurement apparatus of claim 5, wherein the data selected by the controller correspond to an angle of incidence of the light reflected from the sample.

7. The semiconductor measurement apparatus of claim 4, wherein the controller is configured to obtain the first image and the second image from each of the plurality of first original images.

8. The semiconductor measurement apparatus of claim 7, wherein the controller is configured to select data having highest sensitivity to the intensity difference of the polarization element of the light reflected from the sample in each of the first images, and the controller is configured to match the data selected with a wavelength band of light, output by the illumination apparatus, to generate the spectrum.

9. The semiconductor measurement apparatus of claim 7, wherein the controller is configured to select data having highest sensitivity to the phase difference of the polarization element of the light reflected from the sample, in each of the second images, and the controller is configured to match the data selected with a wavelength band of light, output by the illumination apparatus, to generate the spectrum.

10. The semiconductor measurement apparatus of claim 7, wherein the controller is configured to transform the first original image into data defined in a two-dimensional frequency space to find a region in which a signal generated by interference appears, and the controller is configured to inversely transform data, included in the region, to obtain the first image and the second image.

11. The semiconductor measurement apparatus of claim 1, wherein a numerical aperture of the objective lens is 0.9 or more and less than 1.0.

12. The semiconductor measurement apparatus of claim 11, wherein an angle of incidence of light, reflected from the sample to be incident on the objective lens, is 65 degrees or more.

* * * * *